(12) United States Patent
Pan et al.

(10) Patent No.: US 12,464,814 B2
(45) Date of Patent: Nov. 4, 2025

(54) METHOD OF MANUFACTURING SEMICONDUCTOR DEVICES AND SEMICONDUCTOR DEVICES

(71) Applicant: TAIWAN SEMICONDUCTOR MANUFACTURING COMPANY, LTD., Hsinchu (TW)

(72) Inventors: Kuan-Ting Pan, Taipei (TW); Kuo-Cheng Chiang, Zhubei (TW); Shi Ning Ju, Hsinchu (TW); Yi-Ruei Jihan, Keelung (TW); Wei Ting Wang, Taipei (TW); Chih-Hao Wang, Baoshan Township (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 632 days.

(21) Appl. No.: 17/862,801

(22) Filed: Jul. 12, 2022

(65) Prior Publication Data
US 2023/0369327 A1    Nov. 16, 2023

Related U.S. Application Data

(60) Provisional application No. 63/340,839, filed on May 11, 2022.

(51) Int. Cl.
*H10D 84/85*    (2025.01)
*H10D 30/67*    (2025.01)
(Continued)

(52) U.S. Cl.
CPC ....... *H10D 84/851* (2025.01); *H10D 30/6735* (2025.01); *H10D 64/017* (2025.01); *H10D 84/0177* (2025.01); *H10D 84/0179* (2025.01); *H10D 84/0188* (2025.01); *H10D 30/024* (2025.01); *H10D 30/6211* (2025.01); *H10D 62/121* (2025.01); *H10D 84/0193* (2025.01); *H10D 84/85* (2025.01); *H10D 84/853* (2025.01)

(58) Field of Classification Search
CPC ............ H10D 84/851; H10D 84/0188; H10D 30/6735; H10D 64/017
See application file for complete search history.

(56) References Cited

U.S. PATENT DOCUMENTS 10,832,916 B1 *   11/2020   Xie ................... H10D 84/0188
2021/0320210 A1 *  10/2021   Lin ...................... H10D 64/017

* cited by examiner

*Primary Examiner* — Peter M Albrecht
(74) *Attorney, Agent, or Firm* — STUDEBAKER BRACKETT PLLC

(57) ABSTRACT

In a method of manufacturing a semiconductor device, a fin structure including a stacked layer of first semiconductor layers and second semiconductor layers is formed, an isolation insulating layer is formed so that the stacked layer are exposed from the isolation insulating layer, a sacrificial cladding layer is formed over at least sidewalls of the exposed stacked layer, a sacrificial gate electrode is formed over the exposed stacked layer, an interlayer dielectric layer is formed, the sacrificial gate electrode is partially recessed to leave a pillar of the remaining sacrificial gate electrode, the sacrificial cladding layer and the first semiconductor layers are removed, a gate dielectric layer wrapping around the second semiconductor layer and a gate electrode over the gate dielectric layer are formed, the pillar is removed, and one or more dielectric layers are formed in a gate space from which the pillar is removed.

20 Claims, 21 Drawing Sheets

(51) Int. Cl.
   *H10D 64/01* (2025.01)
   *H10D 84/01* (2025.01)
   *H10D 30/01* (2025.01)
   *H10D 30/62* (2025.01)
   *H10D 62/10* (2025.01)

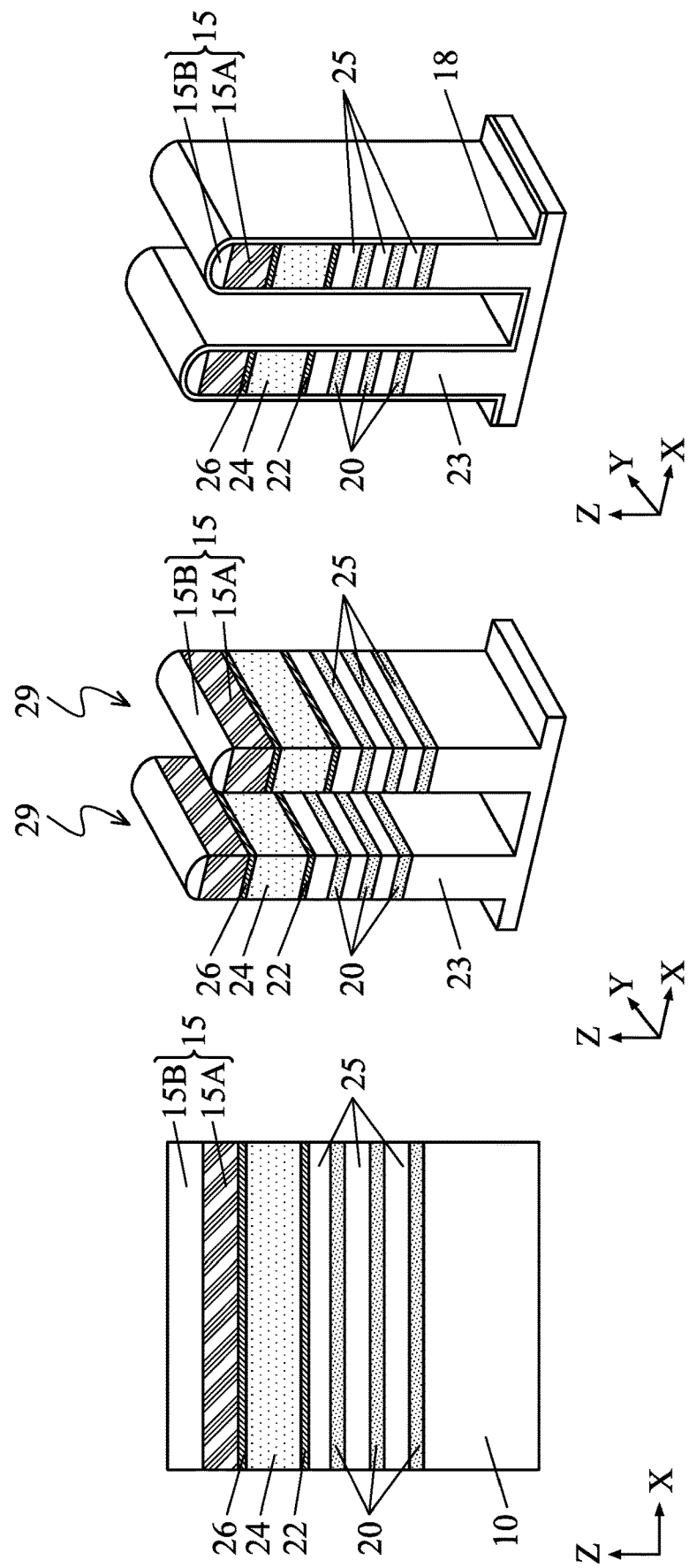

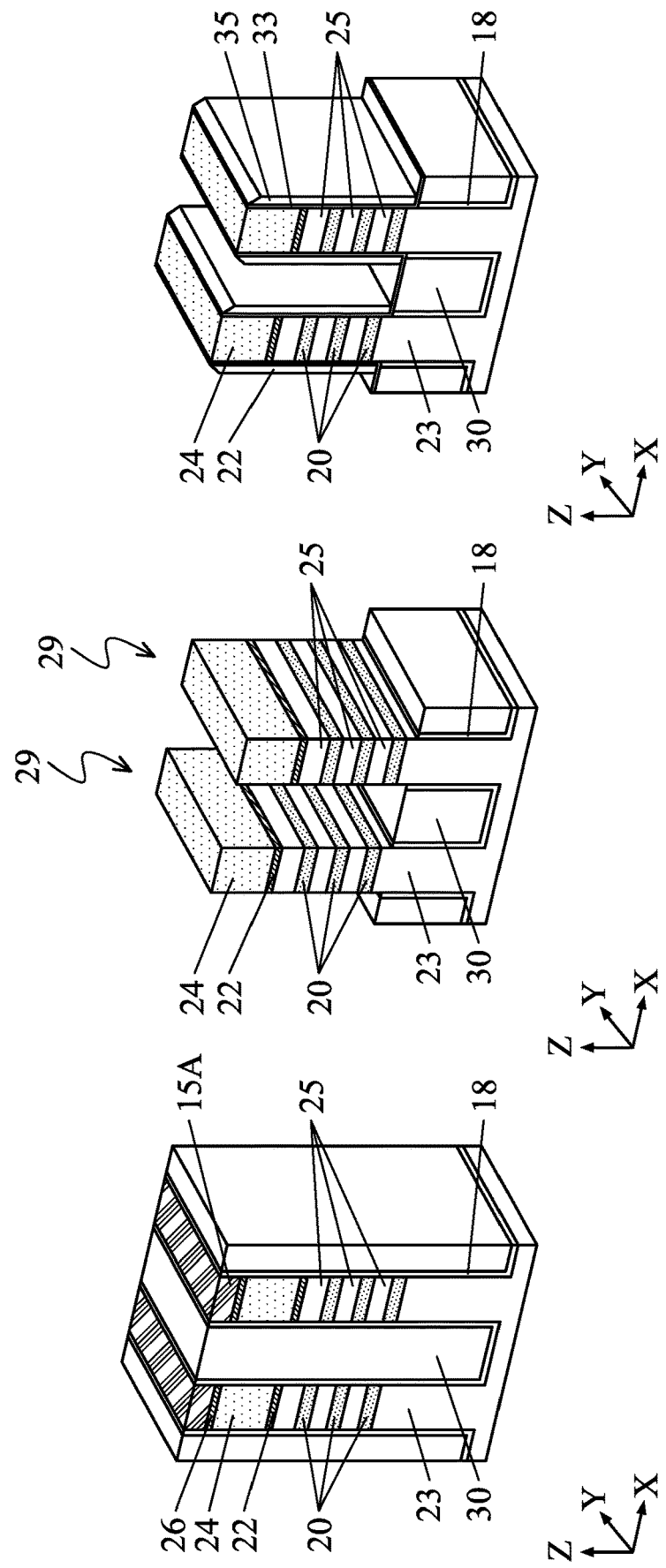

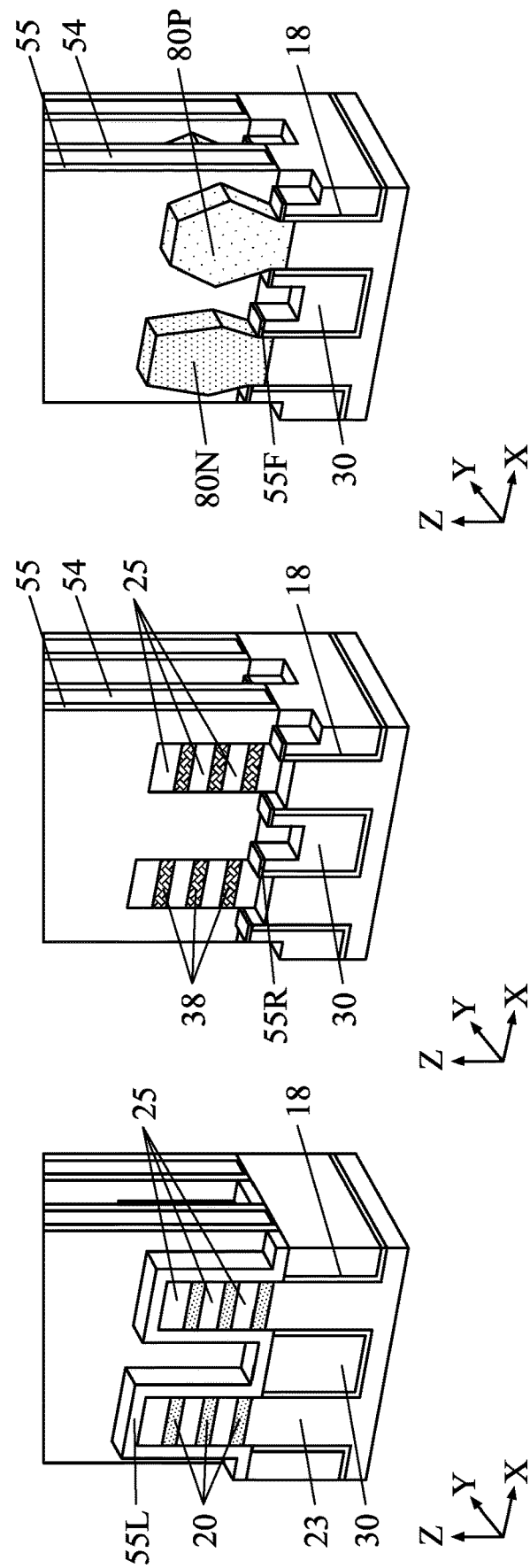

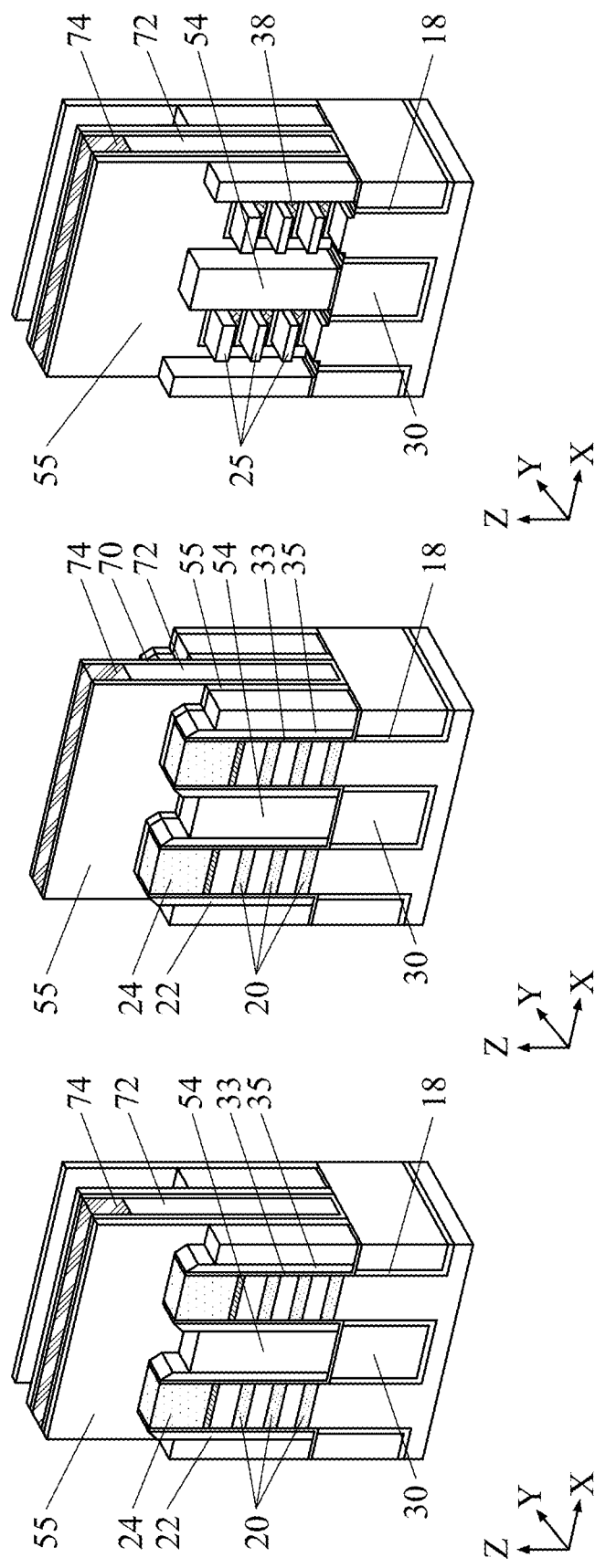

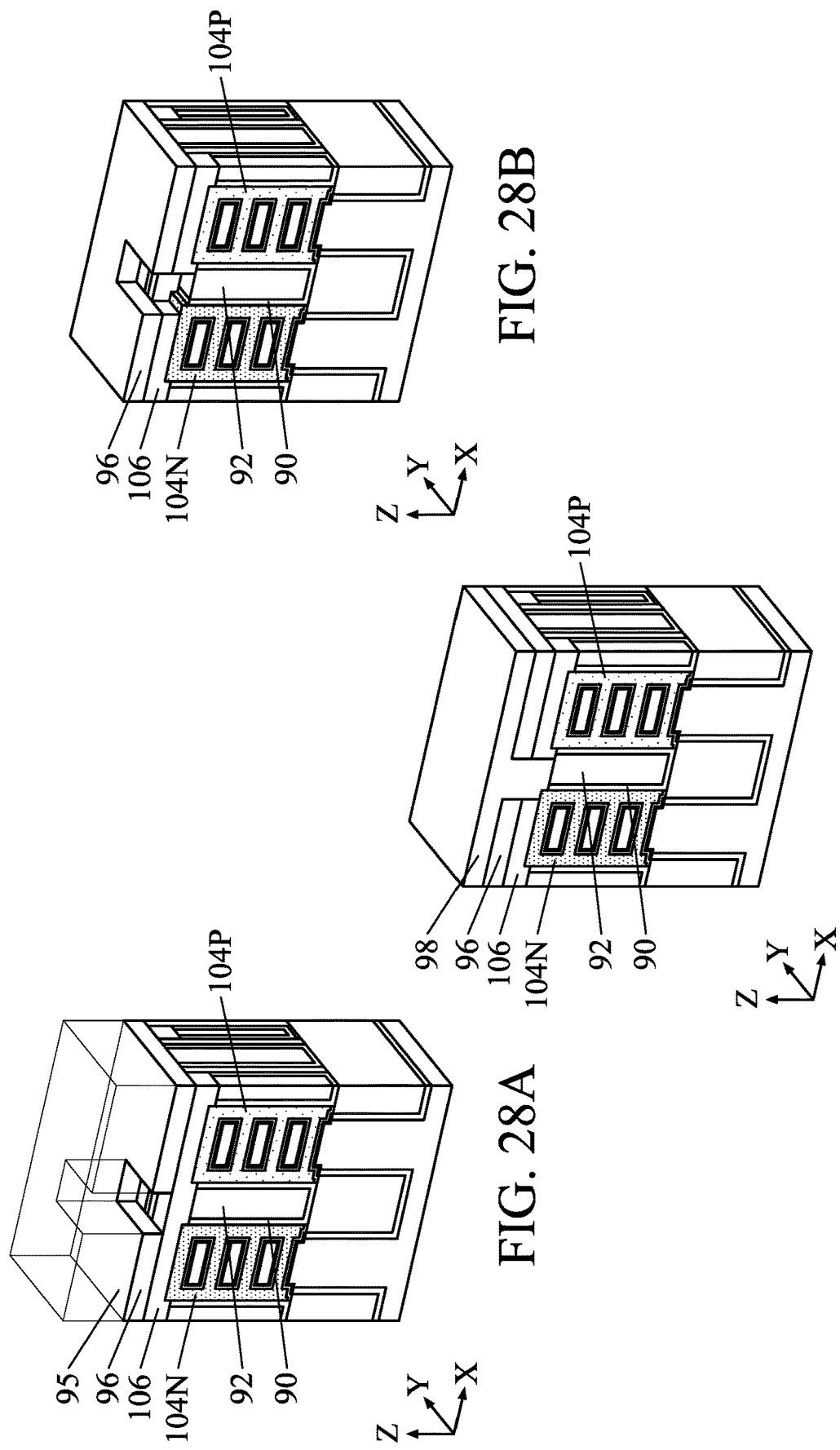

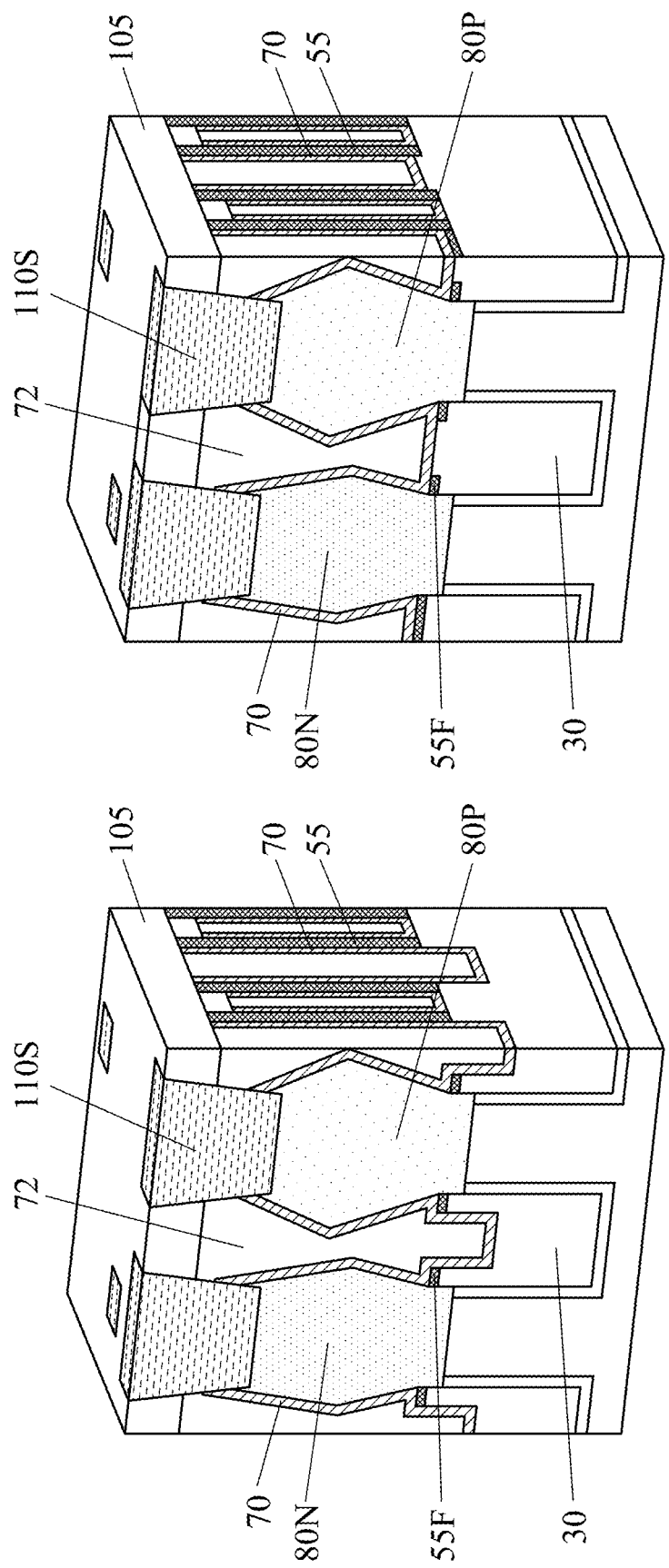

METHOD OF MANUFACTURING SEMICONDUCTOR DEVICES AND SEMICONDUCTOR DEVICES

RELATED APPLICATIONS

This application claims priority to U.S. Provisional Patent Application No. 63/340,839 filed May 11, 2022, the entire content of which is incorporated herein by reference.

BACKGROUND

As the semiconductor industry has progressed into nanometer technology process nodes in pursuit of higher device density, higher performance, and lower costs, challenges from both fabrication and design issues have resulted in the development of three-dimensional designs, such as a multi-gate field effect transistor (FET), including a fin FET (FinFET) and a gate-all-around (GAA) FET. In a FinFET, a gate electrode is adjacent to three side surfaces of a channel region with a gate dielectric layer interposed therebetween. Because the gate structure surrounds (wraps) the fin on three surfaces, the transistor essentially has three gates controlling the current through the fin or channel region. In a GAA FET, all side surfaces of the channel region are surrounded by the gate electrode, which allows for fuller depletion in the channel region and results in less short-channel effects due to steeper sub-threshold current swing (SS) and smaller drain induced barrier lowering (DIBL). As transistor dimensions are continually scaled down to sub 10-15 nm technology nodes, further improvements of the GAA FET are required.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIGS. 1, 2, 3, 4, 5, 6, 7, 8, 9, 10, 11 and 12 shows views of various stages of manufacturing a semiconductor GAA FET device according to an embodiment of the present disclosure.

FIGS. 15A and 15B show various views of one of the various stages of manufacturing a semiconductor GAA FET device according to an embodiment of the present disclosure.

FIGS. 16 and 17 show views of the various stages of manufacturing a semiconductor GAA FET device according to an embodiment of the present disclosure.

FIGS. 28A, 28B and 28C show various views of the various stages of manufacturing a semiconductor GAA FET device according to an embodiment of the present disclosure.

FIGS. 31A, 31B, 31C, 31D, 31E and 31F show various views of semiconductor GAA FET devices according to embodiments of the present disclosure.

DETAILED DESCRIPTION

Figures 7, 8, 9:
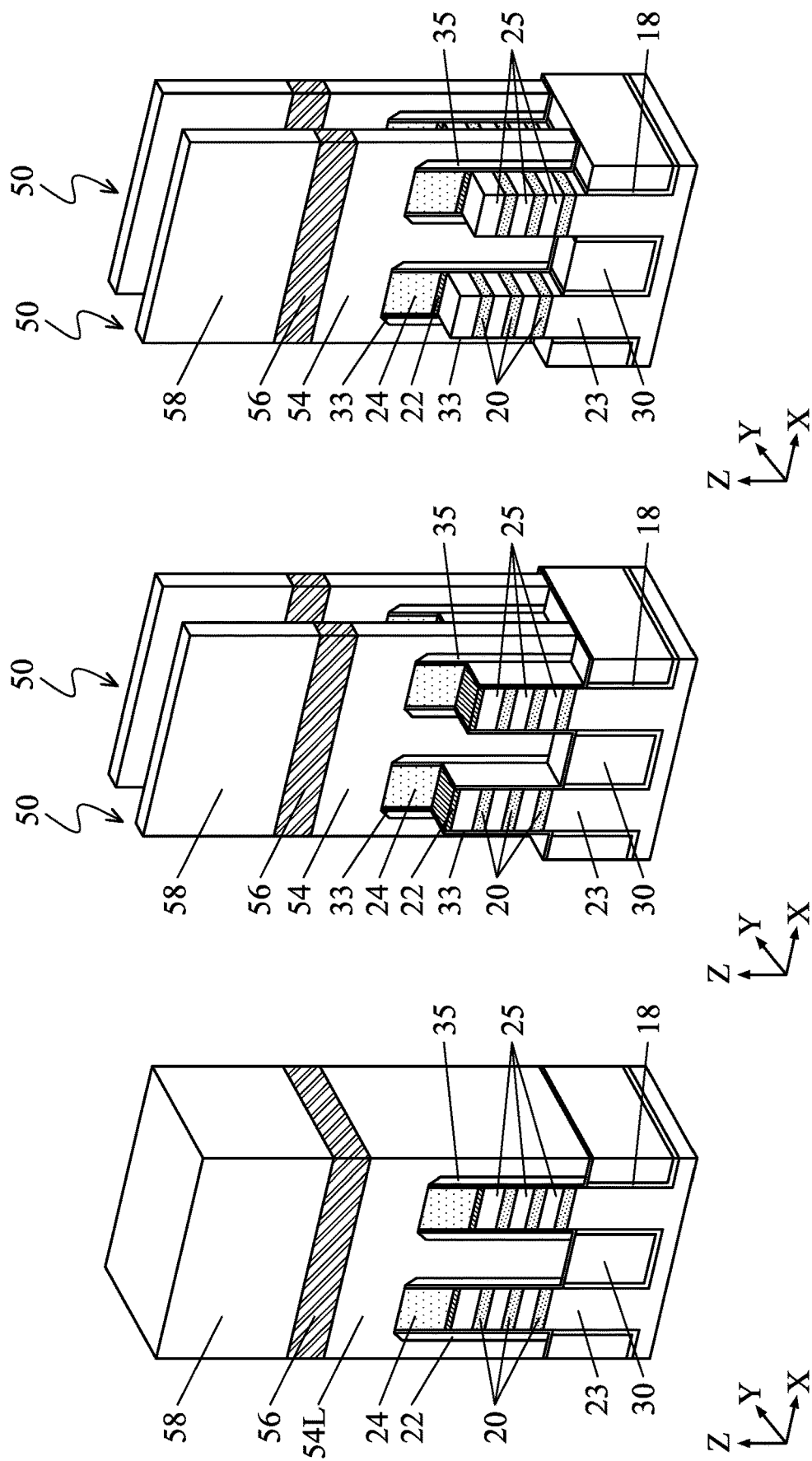

It is to be understood that the following disclosure provides many different embodiments, or examples, for implementing different features of the invention. Specific embodiments or examples of components and arrangements are described below to simplify the present disclosure. These are, of course, merely examples and are not intended to be limiting. For example, dimensions of elements are not limited to the disclosed range or values, but may depend upon process conditions and/or desired properties of the device. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. In addition, the term "being made of" may mean either "comprising" or "consisting of." In the present disclosure, a phrase "one of A, B and C" means "A, B and/or C" (A, B, C, A and B, A and C, B and C, or A, B and C), and does not mean one element from A, one element from B and one element from C, unless otherwise described. In this disclosure, a source/drain (region) refers to a source and/or a drain, individually or collectively dependent upon the context. It is noted that in the present disclosure, a source and a drain are interchangeably used and the structures thereof are substantially the same. Materials, process, configurations and/or processes described with respect to one embodiment are employed in other embodiments, and detailed description thereof may be omitted.

One of the factors to determine device performance of a field effect transistor (FET), such as a fin FET (FinFET) and a gate-all-around (GAA) FET, is size, for example a cell height of a standard cell, of the semiconductor device. In particular, when two adjacent FET structures are closer to each other, physical and/or electrical separation between the adjacent FETs is more important.

FIGS. 1-29D show various stages of manufacturing a semiconductor GAA FET device according to an embodiment of the present disclosure. It is understood that additional operations can be provided before, during, and after processes shown by FIGS. 1-29D, and some of the operations described below can be replaced or eliminated, for additional embodiments of the method. The order of the operations/processes may be interchangeable.

As shown in FIG. 1, first semiconductor layers 20 and second semiconductor layers 25 are alternately formed over a semiconductor substrate 10. In some embodiments, the semiconductor substrate 10 is a crystalline Si substrate. In other embodiments, the substrate 10 includes another elementary semiconductor, such as germanium; a compound semiconductor including Group IV-IV compound semiconductors such as SiC and SiGe, Group III-V compound semiconductors such as GaAs, GaP, GaN, InP, InAs, InSb, GaAsP, AlGaN, AlInAs, AlGaAs, GaInAs, GaInP, and/or GaInAsP; or combinations thereof. In one embodiment, the substrate 10 is a silicon layer of an SOI (silicon-on insulator) substrate.

The first semiconductor layers 20 and the second semiconductor layers 25 are made of materials having different lattice constants, and may include one or more layers of Si, Ge, SiGe, GaAs, InSb, GaP, GaSb, InAlAs, InGaAs, GaSbP, GaAsSb or InP. In some embodiments, the first semiconductor layers 20 and the second semiconductor layers 25 are made of Si, a Si compound, SiGe, Ge or a Ge compound. In one embodiment, the first semiconductor layers 20 are $Si_{1-x}Ge_x$, where x is equal to or more than about 0.2 and equal to or less than about 0.6, and the second semiconductor layers 25 are Si or $Si_{1-y}Ge_y$, where y is smaller than x and equal to or less than about 0.1. In this disclosure, an "M" compound" or an "M based compound" means the majority of the compound is M.

The thickness of the first semiconductor layers 20 may be equal to or smaller than that of the second semiconductor layers 25, and is in a range from about 4 nm to about 30 nm in some embodiments, and is in a range from about 5 nm to about 20 nm in other embodiments. The thickness of the second semiconductor layers 25 is in a range from about 4 nm to about 30 nm in some embodiments, and is in a range from about 5 nm to about 20 nm in other embodiments. The thicknesses of the first semiconductor layers 20 may be the same as, or different from each other and the thicknesses of the second semiconductor layers 25 may be the same as, or different from each other. Although three first semiconductor layers 20 and three second semiconductor layers 25 are shown in FIG. 1, the numbers are not limited to three, and are 1, 2 or more than 3, and less than 10 in some embodiments.

Moreover, in some embodiments, a top semiconductor layer 24 is formed over the stacked structure of the first semiconductor layers 20 and the second semiconductor layers 25. In some embodiments, the top semiconductor layers 24 are $Si_{1-z}Ge_z$, where z is equal to or more than about 0.2 and equal to or less than about 0.7. In some embodiments, z=x. The thickness of the top semiconductor layer 24 is greater than that of each of the first semiconductor layers 20 and the second semiconductor layers 25. In some embodiments, the thickness of the top semiconductor layer 24 is in a range from about 5 nm to about 50 nm, and is in a range from about 15 nm to about 30 nm in other embodiments. In some embodiments, the top semiconductor layer 24 is amorphous or polycrystalline.

In some embodiments, a first pad layer 22 is formed before the top semiconductor layer 24 is formed. In some embodiments, the first pad layer 22 includes one or more of silicon oxide, SiOC, SiC or SiOCN or any combination thereof (e.g., tri-layer of SiOC/SiC/SiOCN). In some embodiments, the first pad layer 22 has a thickness in a range from about 0.5 nm to about 3 nm. Further, in some embodiments, a second pad layer 26 is formed on the top semiconductor layer 24. In some embodiments, the second pad layer 26 includes one or more of silicon oxide, SiOC, SiC or SiOCN or any combination thereof (e.g., tri-layer of SiOC/SiC/SiOCN). In some embodiments, the second pad layer 26 has a thickness in a range from about 0.5 nm to about 3 nm.

Further, a hard mask layer 15 including one or more layers of an insulating material or an amorphous semiconductor material (e.g., a-Si) is formed over the second pad layer 26. In some embodiments, the hard mask layer 15 includes a first hard mask layer 15A and a second hard mask layer 15B. In some embodiments, the first hard mask layer 15A is silicon nitride having a thickness in a range from 5 nm to about 20 nm and the second hard mask layer 15B is silicon oxide having a thickness in a range from about 5 nm to about 20 nm.

After the stacked layers as shown in FIG. 1 are formed, fin structures are formed by using one or more lithography and etching operations, as shown in FIG. 2. The fin structures may be patterned by any suitable method. For example, the fin structures may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the hard mask layer 15. By using the patterned hard mask layer as an etching mask, the stacked semiconductor layers are patterned into fin structures 29 as shown in FIG. 2.

In FIG. 2, the fin structures 29 extend in the Y direction and are arranged in the X direction. The number of the fin structures is not limited to two as shown in FIG. 2, and may be as small as one and three or more. In some embodiments, one or more dummy fin structures are formed on both sides of the fin structures 29 to improve pattern fidelity in the patterning operations. As shown in FIG. 2, the alternate stack of the first and second semiconductor layers is disposed on a bottom fin structure 23.

The width of the upper portion of the fin structure 29 along the Y direction is in a range from about 5 nm to about 40 nm in some embodiments, and is in a range from about 10 nm to about 30 nm in other embodiments.

After the fin structures 29 are formed as shown in FIG. 2, one or more liner layers 18 are formed over the fin structures 29, as shown in FIG. 3. In some embodiments, the liner layer 18 includes a semiconductor material, such as Si or SiGe. When the SiGe is used for the liner layer 18, the Ge amount in the liner layer 18 is smaller than the Ge amount in the first semiconductor layers 20 and/or the top semiconductor layer 24. In some embodiments, the liner layer 18 is made of non-doped or doped Si having a thickness in a range from about 0.2 nm to about 2 nm. In some embodiments, the liner layer 18 is amorphous or polycrystalline.

Then, as shown in FIG. 4, an insulating material layer 30L including one or more layers of insulating material is formed over the substrate so that the fin structures 29 with the liner layer 18 are fully embedded in the insulating material layer 30L.

The insulating material for the insulating material layer 30L includes one or more of silicon oxide, silicon nitride, silicon oxynitride (SiON), SiOCN, SiOC, SiCN, fluorine-doped silicate glass (FSG), or a low-k dielectric material. In some embodiments, the insulating material layer 30L is made of silicon oxide. The insulating material layer 30L is formed by LPCVD (low pressure chemical vapor deposition), plasma-enhanced CVD (PECVD), flowable CVD and/or atomic layer deposition (ALD). An anneal operation may be performed after the formation of the insulating material layer 30L. Then, a planarization operation, such as a chemical mechanical polishing (CMP) method and/or an etch-back method, is performed such that the upper surface of the hard mask layer 15 (the first hard mask layer 15A) is exposed from the insulating material layer 30L, as shown in FIG. 4.

Then, as shown in FIG. 5, the insulating material layer 30L is recessed to form an isolation insulating layer 30 so that the upper portions of the fin structures 29 are exposed. With this operation, the fin structures 29 are separated from each other by the isolation insulating layer 30, which is also called a shallow trench isolation (STI).

In some embodiments, the insulating material layer 30L is recessed until the upper portion of the bottom fin structure 23 is exposed. The first semiconductor layers 20 are sacrificial layers which are subsequently removed, and the second semiconductor layers 25 are subsequently formed into semiconductor wires or sheets (nano-bodies or nano-structures) as channel layers of a GAA FET. In some embodiments, during or after the recess etching of the insulating layer 30L, the liner layer 18, the hard mask layer 15 and the second pad layer 26 are removed, thereby exposing the top semiconductor layer 24, as shown in FIG. 5.

After the isolation insulating layer 30 is formed, a sacrificial cladding layer 35 is formed over the exposed portion of the fin structures 29, as shown in FIG. 6. In some embodiments, before the sacrificial cladding layer 35 is formed, a third pad layer 33 is formed over the exposed portion of the fin structure 29, and the sacrificial cladding layer 35 is formed over the third pad layer 33.

The sacrificial cladding layer 35 includes one or more insulating materials or semiconductor materials. In some embodiments, the sacrificial cladding layer 35 includes amorphous or poly crystalline semiconductor material (e.g., Si, SiC, SiGe or Ge). In certain embodiments, the sacrificial cladding layer 35 is amorphous or polycrystalline SiGe, having a Ge concentration in a range from about 20 atomic % to about 40 atomic %. In some embodiments, the Ge concentration of the sacrificial cladding layer 35 is the same as or similar to (difference within±5%) the Ge concentration of the first semiconductor layer 20. In some embodiments, the thickness of the sacrificial cladding layer 35 is in a range from about 5 nm to about 50 nm. If the thickness of the sacrificial cladding layer 25 is smaller than this range, electrical separation between adjacent fin structures would be insufficient. If the thickness of the sacrificial cladding layer 25 is larger than this range, a space for a metal gate formation is too small and some of the layers of the metal gate structure would not be properly formed.

The sacrificial cladding layer 35 is conformally formed by CVD or ALD in some embodiments. The deposition temperature of the sacrificial cladding layer 35 is less than or similar to the deposition temperature of the first semiconductor layers 20, in some embodiments. In some embodiments, the deposition temperature of the sacrificial cladding layer 35 is in a range from about 500° C. to 650° C. The source gas includes a mixture of $SiH_4$, $GeH_4$, and HCl with $H_2$ or $N_2$ as a carrier gas. The sacrificial cladding layer 35 controls stress in the isolation area. In some embodiments, the third pad layer 33 includes one or more of silicon oxide, SiOC, SiC or SiOCN or any combination thereof (e.g., tri-layer of SiOC/SiC/SiOCN). In some embodiments, the third pad layer 33 has a thickness in a range from about 0.5 nm to about 3 nm.

Then, as shown in FIG. 6, one or more etch-back operations are performed to remove horizontal portions of the sacrificial cladding layer 35 so as to expose the upper surface of the top semiconductor layer 24 and the upper surface of the isolation insulating layer 30. In some embodiments, after the deposition-etching operation, a wet cleaning process to remove residuals is performed.

Subsequently, a sacrificial gate electrode layer 54L is formed over the fin structures 29 with the sacrificial cladding layers 35, and a first hard mask layer 56 and a second hard mask layer 58 are formed over the sacrificial gate electrode layer 54L, as shown in FIG. 7. The sacrificial gate electrode layer 54L is blanket deposited such that the fin structures 29 are fully embedded in the sacrificial gate electrode layer 54L. The sacrificial gate electrode layer 54L includes silicon such as polycrystalline silicon or amorphous silicon. In some embodiments, the sacrificial gate electrode layer 54L is subjected to a planarization operation. The sacrificial gate electrode layer 54L is deposited using CVD, including LPCVD and PECVD, PVD, ALD, or other suitable process. In some embodiments, the first hard mask layer 56 is made of silicon nitride and the second hard mask layer 58 is made of silicon oxide.

Next, a patterning operation is performed on the hard mask layers and the sacrificial gate electrode layer 54L is patterned into sacrificial gate structures 50 having a sacrificial gate electrode 54, as shown in FIG. 8. In some embodiments, the width of the sacrificial gate electrode 54 is in a range from about 5 nm to about 30 nm and is in a range from about 10 nm to about 20 nm in other embodiments. Two or more sacrificial gate electrodes are arranged in the Y direction in some embodiments. In certain embodiments, one or more dummy sacrificial gate electrodes are formed on both sides of the sacrificial gate electrodes to improve pattern fidelity.

In some embodiments, during the patterning (etching) of the sacrificial gate electrode layer 54L, part of the top semiconductor layer 24 is removed at the source/drain regions, as shown in FIG. 8. The third pad layer 33 formed on the sides of the top semiconductor layer 24 is also removed during the etching in some embodiments.

Next, as shown in FIG. 9, the third pad layer 33 and the first pad layer 22 are removed in some embodiments to expose the stacked layers of the first and second semiconductor layers 20, 25 at the source/drain region.

Further, a layer 55L for sidewall spacers is formed over the sacrificial gate structures and the exposed stacked layers as shown in FIG. 10. One or more insulating layers are deposited in a conformal manner to have substantially equal thicknesses on vertical surfaces, such as the sidewalls, horizontal surfaces, and the top of the sacrificial gate structures and the exposed stacked layers.

Then, by using anisotropic etching, the gate sidewall spacers 55 are formed as shown in FIG. 11. In some embodiments, the gate sidewall spacer 55 has a thickness in a range from about 3 nm to about 20 nm. The gate sidewall spacers 55 include one or more of aluminum oxide, hafnium oxide, zirconium oxide, silicon nitride, silicon oxide, SiON, SiCN, SiCO, SiOCN or any other suitable dielectric material.

Further, as shown in FIG. 11, the stacked layers of the first and second semiconductor layers 20, 25 at the source/drain region are recessed to the level below the upper surface of the isolation insulating layer 30. In some embodiments, part of the isolation insulating layer 30 between the stacked layers is also recessed as shown in FIG. 11. In some embodiments, a residual layer 55R remains at the sides of the recessed source/drain regions as shown in FIG. 11.

Further, inner spacers 38 are formed as shown in FIG. 11. The first semiconductor layers 20 are laterally etched in the Y direction under the gate sidewall spacers 55, thereby forming cavities. The lateral amount of etching of the first semiconductor layer 20 is in a range from about 0.5 nm to about 10 nm in some embodiments, and is in a range from about 1 nm to about 5 nm in other embodiments.

When the first semiconductor layers 20 are SiGe and the second semiconductor layers 25 are Si, the first semiconductor layers 20 can be selectively etched by isotropic etching, such as wet etching. A wet etchant includes a mixed solution of $H_2O_2$, $CH_3COOH$ and HF, followed by $H_2O$ cleaning in some embodiments. In some embodiments, the etching by the mixed solution and cleaning by water is repeated 10 to 20 times. The etching time using the mixed solution is in a range from about 1 min to about 2 min in some embodiments. The mixed solution is used at a temperature in a range from about 60° C. to about 90° C. in some embodiments.

Then, a dielectric layer is conformally formed on the etched lateral ends of the first semiconductor layers 20 and on end faces of the second semiconductor layers 25. The dielectric layer includes one of aluminum oxide, silicon nitride, and silicon oxide, SiON, SiOC, SiCN, SiOCN, or any other suitable dielectric material. The dielectric layer is made of a different material than the sidewall spacers 55 in some embodiments. The dielectric layer can be formed by ALD or any other suitable methods.

After the dielectric layer is formed, an etching operation is performed to partially remove the dielectric layer, thereby forming inner spacers 38, as shown in FIG. 11. In some embodiments, the end face of the inner spacers 38 is recessed more than the end face of the second semiconductor layers 25. The recessed amount is in a range from about 0.2 nm to about 3 nm in some embodiments and is in a range from about 0.5 nm to about 2 nm in other embodiments. In other embodiments, the recessed amount is less than 0.5 nm and may be equal to zero (the end face of the inner spacer 38 and the end face of the second semiconductor layers 25 are flush with each other). In some embodiments, before forming the dielectric layer, an additional dielectric layer having a smaller thickness than the dielectric layer is formed, and thus the inner spacers 38 have a two-layer structure. In some embodiments, the inner spacers 38 are made of the same material as or different material from the gate sidewall spacers 55.

Subsequently, as shown in FIG. 12, source/drain epitaxial layers are formed. The source/drain epitaxial layer 80N for an n-type FET includes one or more layers of SiP, SiAs, SiCP, SiPAs and/or SiC, and the source/drain epitaxial layer 80P for a p-type FET includes one or more layers of SiGe, GeSn and/or SiGeSn, which optionally contains B. In some embodiments, the source/drain epitaxial layer includes multiple layers. The source/drain epitaxial layers are formed by an epitaxial growth method using CVD, ALD or molecular beam epitaxy (MBE). As shown in FIG. 12, no dielectric wall structure separating adjacent epitaxial layers along the X direction exists in some embodiments.

Figure 13B:
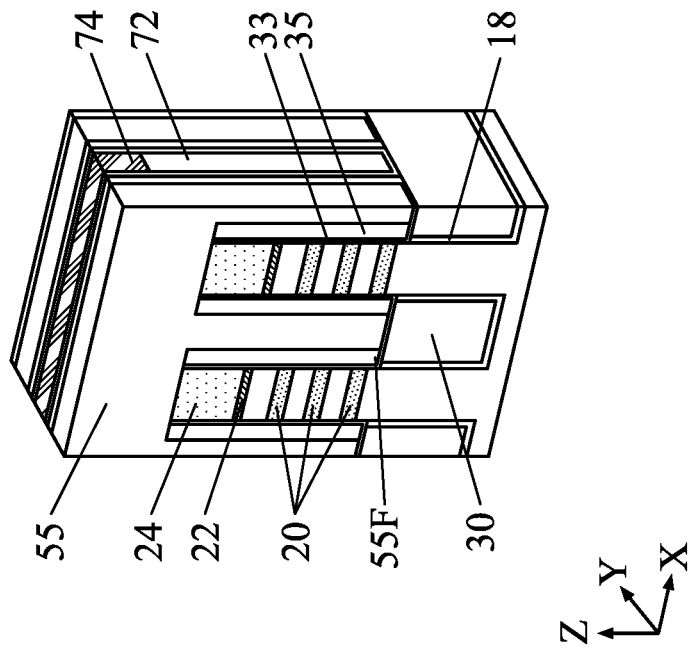
FIGS. 13A and 13B show various views of one of the various stages of manufacturing a semiconductor GAA FET device according to an embodiment of the present disclosure.
Figure 13A:
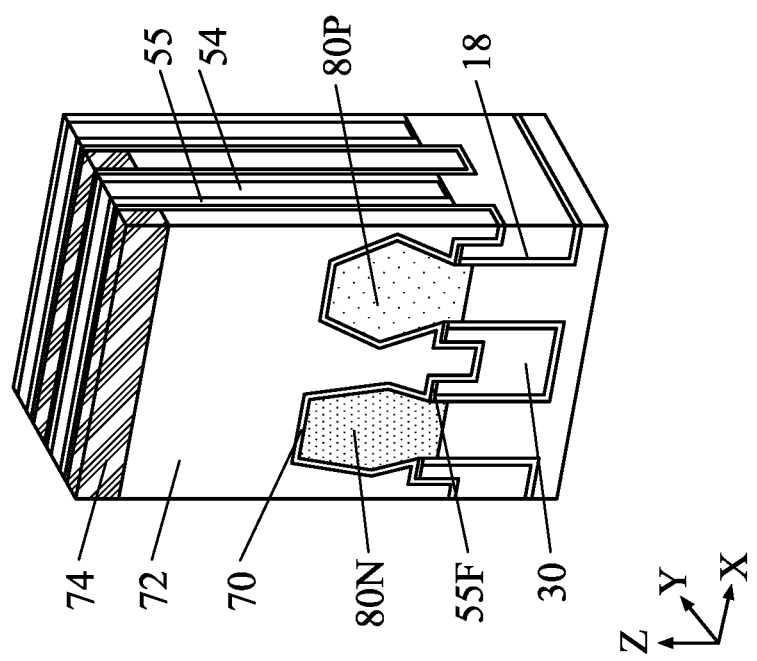

After the source/drain epitaxial layers are formed, an etch stop layer 70 is formed over the source/drain epitaxial layers and a first interlayer dielectric (ILD) layer 72 is formed over the etch stop layer 70 as shown in FIGS. 13A and 13B. FIG. 13A is a cross sectional view cutting the source/drain epitaxial layers 80N, 80P, and FIG. 13B is a cross sectional view cutting the sacrificial gate electrode layer 54, both in the X direction.

The etch stop layer 70 is made of silicon nitride, SiON or any suitable insulating material, and the first ILD layer 72 made of a different material than the etch stop layer 70 and includes one of silicon oxide, SiON, SiOC, SiCN, SiOCN, or any other suitable dielectric material. Then, one or more planarization operations, such as a CMP operation, are performed to expose the upper surface of the sacrificial gate electrode 54 as shown in FIGS. 13A and 13B.

In some embodiments, the first ILD layer 72 is recessed and then a cap insulating layer 74 is formed over the recessed first ILD layer 72 as shown in FIGS. 13A and 13B. The cap insulating layer 74 is made of silicon nitride, SiON or any suitable insulting material.

Figures 14A, 14B, 14C:
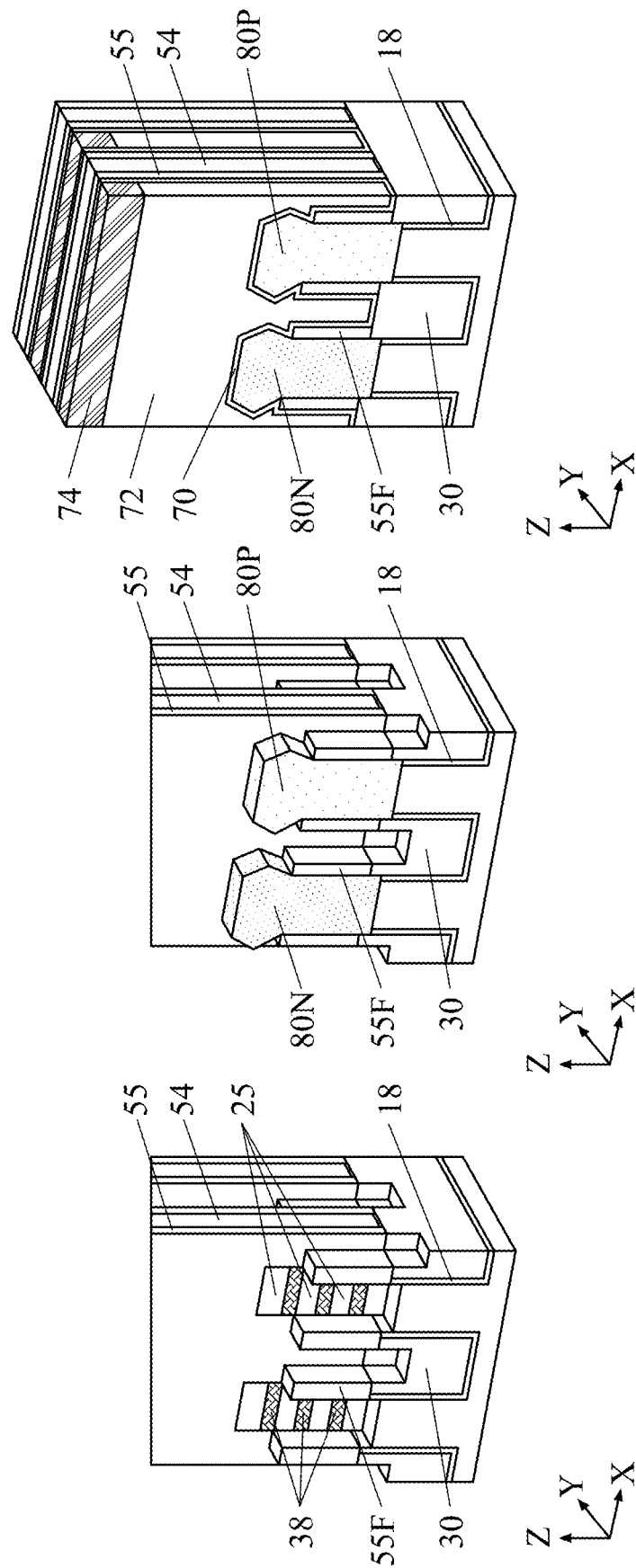
FIGS. 14A, 14B and 14C show various views of the various stages of manufacturing a semiconductor GAA FET device according to an embodiment of the present disclosure.

In some embodiments, when forming the gate sidewall spacers 55, the blanket layer 55L formed on the sidewalls of the stacked layers at the source/drain regions remains thicker than the case shown in FIG. 11, thereby forming fin sidewalls 55F, as shown in FIG. 14A. As shown in FIG. 14B, the source/drain epitaxial layers 80N, 80P have a lower portion restrained by the fin sidewall 55F and a top portion. In some embodiments, the thickness of the top portion in the Z direction is smaller than the thickness of the bottom portion. FIG. 14C shows the structure after the first ILD layer 72 and the cap insulating layer 74 are formed similar to FIG. 13A.

Then, the sacrificial gate electrode 54 is partially recessed to the level below the top of the top semiconductor layer 24 and above the isolation insulating layer 30, as shown in FIG. 15A. In some embodiments, the sacrificial gate electrode 54 is recessed to the level between the bottom of the top semiconductor layer 24 and the top of the top semiconductor layer 24. In some embodiments, the gate sidewall spacers 55 is also recessed to the same level, thereby exposing the side faces of the etch stop layer 70, as shown in FIG. 15B.

Then, the top semiconductor layer 24, the sacrificial cladding layer 35, the third pad layer 33 and the first pad layer 22 are removed by one or more dry and/or wet etching operations. Subsequently, the first semiconductor layers 20 are removed, thereby forming wires or sheets, or semiconductor nano-bodies (channel regions) of the second semiconductor layers 25, as shown in FIG. 16. When the first semiconductor layers 20, the top semiconductor layer 24 and the sacrificial cladding layer 35 are formed by SiGe, the SiGe layers are removed by using a wet etchant such as a TMAH solution in some embodiments.

Figure 17:
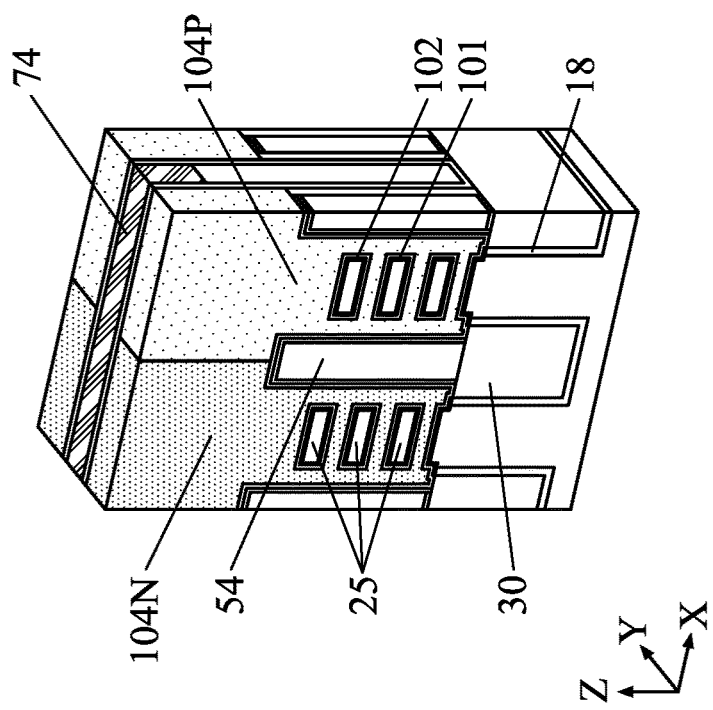

After the semiconductor wires or sheets (channel regions) of the second semiconductor layers 25 are released, a gate dielectric layer 102 is formed around each channel region, and further, gate electrode layers 104N, 104P are formed on the gate dielectric layer 102, as shown in FIG. 17.

In some embodiments, the gate dielectric layer 102 includes one or more layers of a dielectric material, such as silicon oxide, silicon nitride, or a high-k dielectric material, other suitable dielectric material, and/or combinations thereof. Examples of high-k dielectric materials include $HfO_2$, HfSiO, HfSiON, HfTaO, HfTiO, HfZrO, zirconium oxide, aluminum oxide, titanium oxide, hafnium dioxide-alumina ($HfO_2$—$Al_2O_3$) alloy, other suitable high-k dielectric materials, and/or combinations thereof. In some embodiments, an interfacial layer 101 is formed between the channel layers and the gate dielectric layer 102. The gate dielectric layer 102 may be formed by CVD, ALD or any suitable method. In one embodiment, the gate dielectric layer 102 is formed using a highly conformal deposition process such as ALD in order to ensure the formation of a gate dielectric layer having a uniform thickness around each channel layers. The thickness of the gate dielectric layer 102 is in a range from about 1 nm to about 6 nm in one embodiment. The interfacial layer includes a chemical oxide, such as silicon oxide. The interfacial layer 101 and the gate dielectric layer 102 are also formed over the remaining sacrificial gate electrode 54 (silicon pillar).

The gate electrode layers 104N, 104P are formed on the gate dielectric layer 102 to surround each channel layer. The gate electrode includes one or more layers of conductive material, such as polysilicon, aluminum, copper, titanium, tantalum, tungsten, cobalt, molybdenum, tantalum nitride, nickel silicide, cobalt silicide, TiN, WN, TiAl, TiAlN, TaCN, TaC, TaSiN, metal alloys, other suitable materials, and/or combinations thereof. The gate electrode layer may be formed by CVD, ALD, electro-plating, or other suitable method. The gate dielectric layer and the gate electrode layer are then planarized by using, for example, CMP, until the top surface of the cap insulating layer 74 is revealed.

In some embodiments, the gate electrode layer 104N for the n-type FET has a different material configuration than the gate electrode layer 104P for the p-type FET, as shown in FIG. 17. In particular, the gate electrode layer 104N for the n-type FET includes one or more work function adjustment layers different from the gate electrode layer 104P for the p-type FET. The work function adjustment layers are made of a conductive material such as a single layer of TiN, TaN, TaAlC, TiC, TaC, Co, Al, TiAl, HfTi, TiSi, TaSi or TiAlC, or a multilayer of two or more of these materials. For the n-channel FET, one or more of TaN, TaAlC, TiN, TiC, Co, TiAl, HfTi, TiSi and TaSi is used as the work function adjustment layer, and for the p-channel FET, one or more of TiAlC, Al, TiAl, TaN, TaAlC, TiN, TiC and Co is used as the work function adjustment layer. The work function adjustment layer may be formed by ALD, PVD, CVD, e-beam evaporation, or other suitable process. Further, the work function adjustment layer may be formed separately for the n-channel FET and the p-channel FET which may use different metal layers. In some embodiments, gate electrode layers 104N, 104P include only the work function adjustment material layers and do not include a W (tungsten) layer.

Figure 18A:
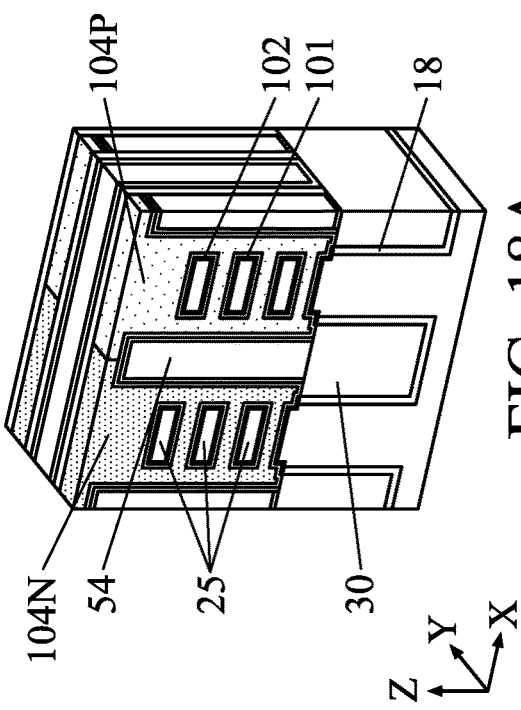
FIGS. 18A and 18B show various views of one of the various stages of manufacturing a semiconductor GAA FET device according to an embodiment of the present disclosure.
Figure 18B:
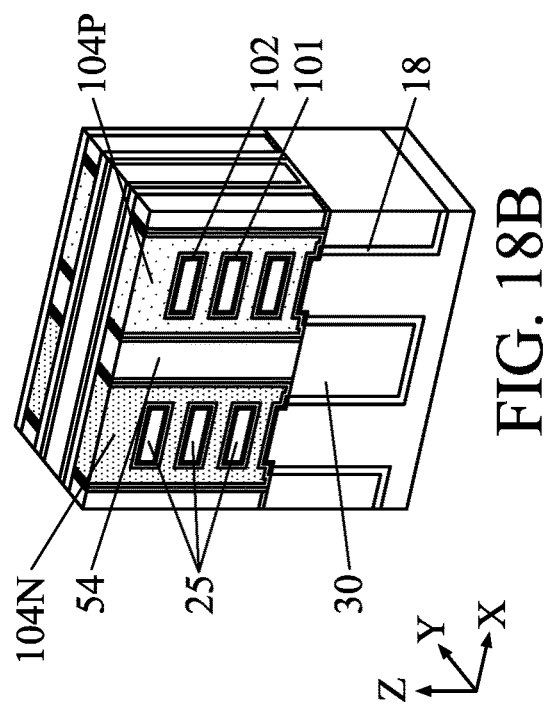

Further, as shown in FIG. 18A, one or more planarization operations are further performed to reduce the height of the gate electrode layers 104N, 104P. In some embodiments, the first ILD layer 72 is exposed. In some embodiments, the gate electrode layer 104N for the n-type FET touches the gate electrode layer 104P for the p-type FET as shown in FIG. 18A. In other embodiments, the planarization operation is performed such that the gate electrode layer 104N for the n-type FET is separated from the gate electrode layer 104P for the p-type FET, as shown in FIG. 18B.

Figure 19:
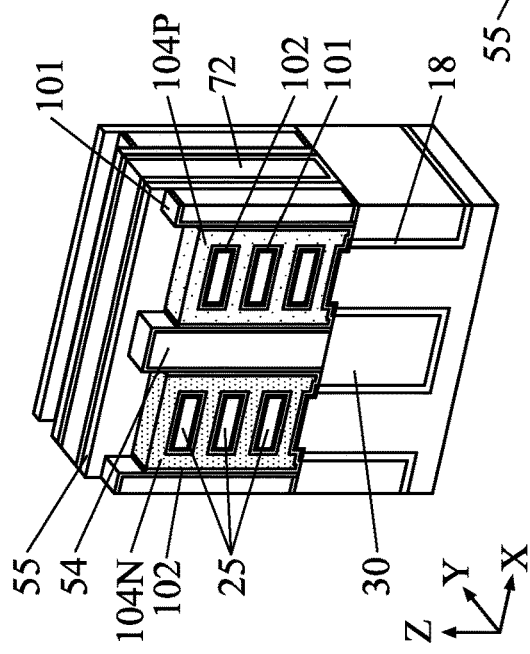

Then, as shown in FIG. 19, the gate electrode layers 104N, 104P are recessed to a level below a top of the remaining sacrificial gate electrode 54. As shown in FIG. 19, the remaining sacrificial gate electrode 54 is covered by the interfacial layer 101 and the gate dielectric layer 102. In some embodiments, the gate dielectric layer 102 formed on the sides of the remaining sacrificial gate electrode 54 is removed and the interfacial layer 101 is exposed.

Figure 20:
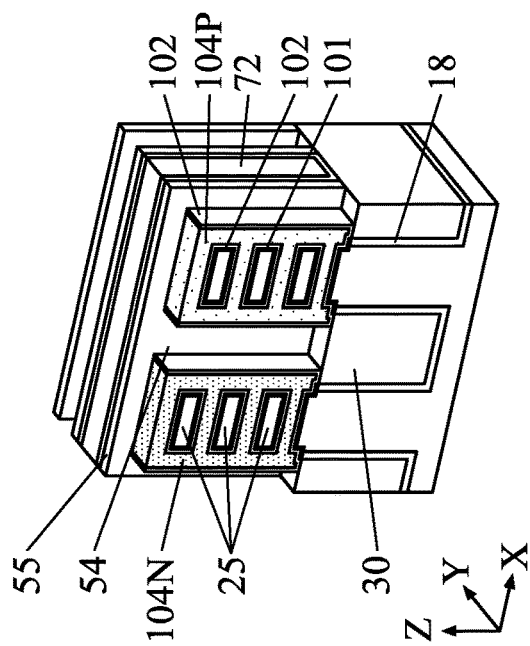
FIGS. 19, 20, 21, 22, 23, 24, 25, 26 and 27 show various views of the various stages of manufacturing a semiconductor GAA FET device according to an embodiment of the present disclosure.
Figure 21:
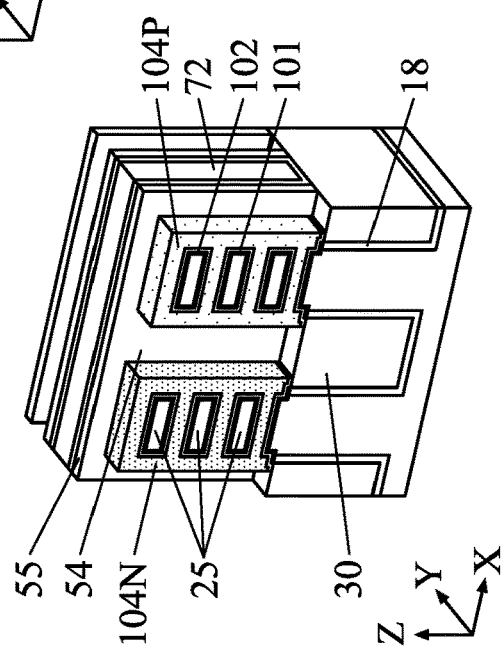

Next, as shown in FIG. 20, the remaining sacrificial gate electrode 54 is removed. Further, as shown in FIG. 21, the gate dielectric layer 102 remaining on the side faces of the gate electrode layers 104N, 104P is removed. In some embodiments, one or more trim etching operations are performed to trim (etch) the gate electrode layers 104N, 104P, as shown in FIG. 21.

Figure 22:
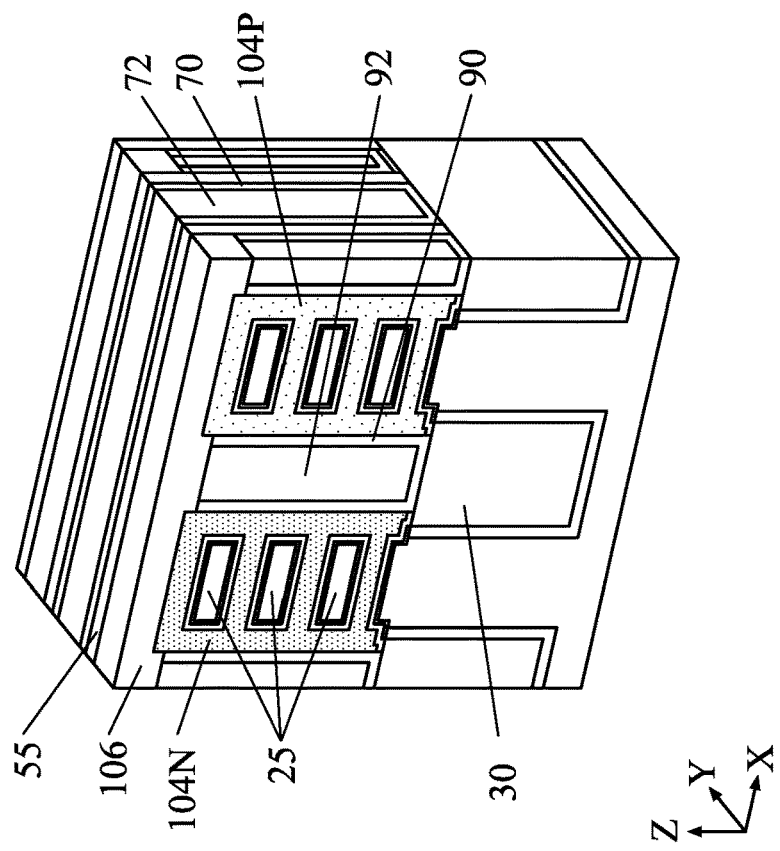

Subsequently, a gate separation wall is formed between the adjacent gate electrodes 104P and 104N. In some embodiments, the adjacent gate electrodes are for the same conductivity type gate channels. In some embodiments, the gate separation wall includes a first insulating layer 90 and a second insulating layer 92, as shown in FIG. 22. Blanket layers of the first and second insulating layers are formed, and then an etch back operation is performed to recess the blanket layers down to the level below the top of the gate electrode layers 104P, 104N.

In some embodiments, the first insulating layer 90 includes one or more of silicon oxide, silicon nitride, SiCN, SiOC, SiOCN or SiC. In some embodiments, the first insulating layer 90 is made of a low-k dielectric material. In some embodiments, the second insulating layer 92 is made of a different material than the first insulating layer 90 and includes one or more of silicon oxide, SiOCN or SiON.

Figure 23:
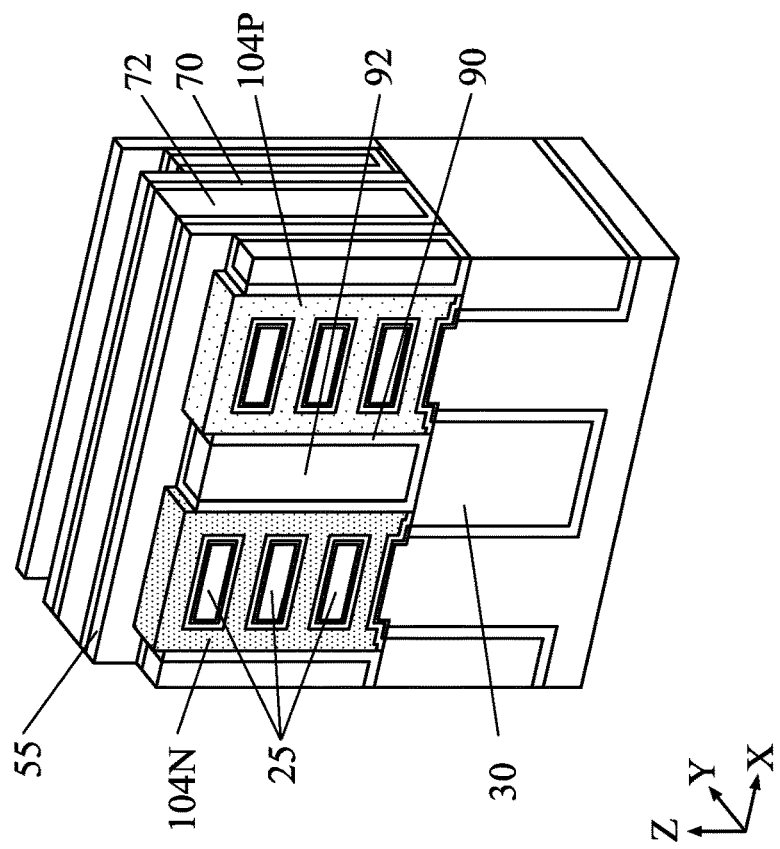

Then, as shown in FIG. 23, a conductive layer as a top gate electrode layer 106 is formed over the gate electrode layers 104P, 104N to connect the gate electrode layers 104P, 104N. In some embodiments, the conductive layer 106 includes one or more of W, Ru or Co. In some embodiments, after a blanket layer of metal material is formed and a CMP operation is performed to form the conductive layer 106 as shown in FIG. 23.

Figure 24:
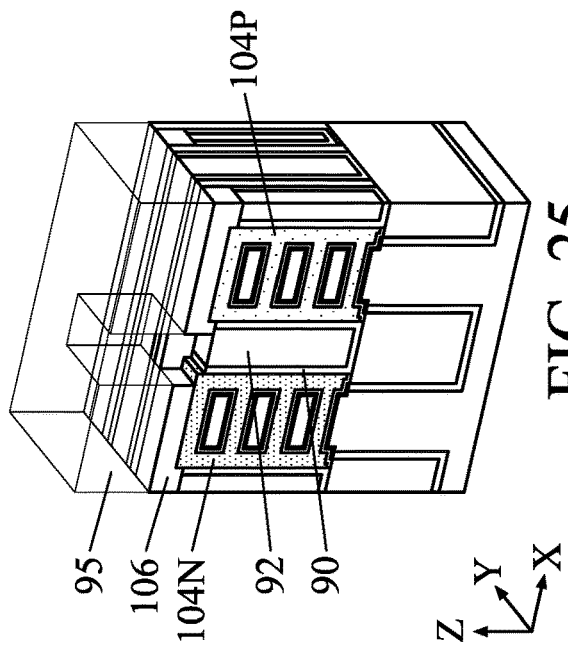
Figure 25:
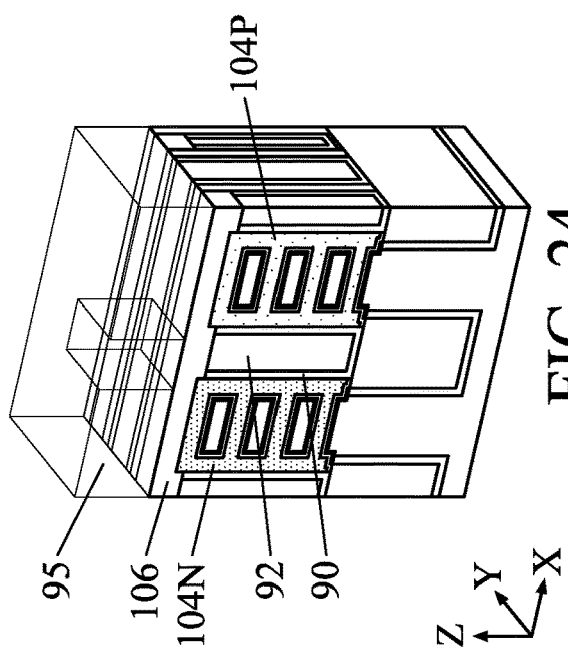

Next, as shown in FIG. 24, a mask pattern 95, for example, a photo resist pattern, having one or more opening is formed over the conductive layer 106. Then, as shown in FIG. 25, the conductive layer 106 is cut into pieces where necessary to electrically separate the adjacent gate electrodes. As shown in FIG. 25, the etching of the conductive layer 106 stops on the gate electrode 104P or 104N and the gate separation wall 90, 92, by a self-align manner.

Figure 26:
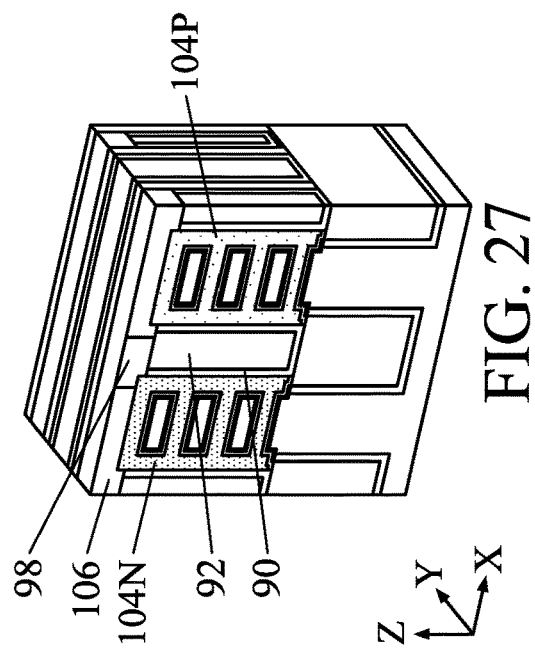
Figure 27:
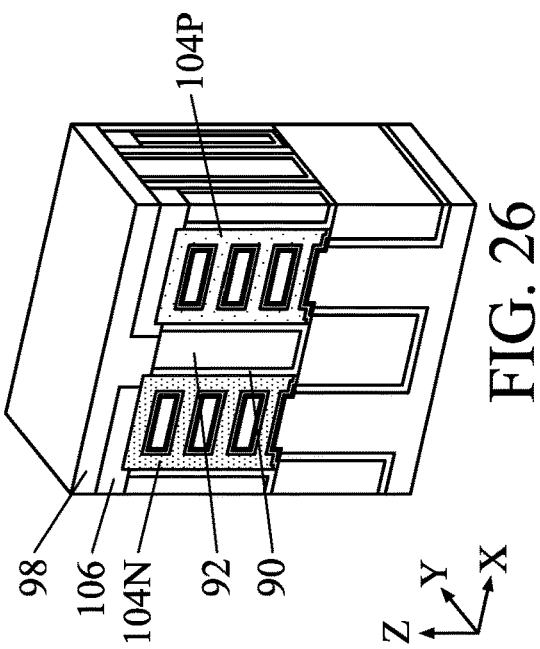

Then, one or more insulating layers 98 are formed as shown in FIG. 26, and a CMP operation is performed to form an insulating plug 98 separating the conductive layer 106 as shown in FIG. 27. In some embodiments, the insulating layer 98 includes one or more of silicon oxide, silicon nitride, SiCN, SiOC, SiOCN or SiC. In some embodiments, the insulating layer 98 is made of a low-k dielectric material.

In some embodiments, before the mask layer 95 is formed, a lower insulating layer 96 is formed over the conductive layer 106, and the lower insulating layer 96 is patterned using the mask layer 95 as an etching mask, as shown in FIG. 28A. Then, the top gate electrode 106 is cut into pieces using the patterned lower insulating layer 96 as an etching mask, as shown in FIG. 28B. Then, one or more insulating layers 98 are formed as shown in FIG. 28C, and a CMP operation is performed to form an insulating plug 98 separating the top gate electrodes 106 as shown in FIG. 27.

Figure 29B:
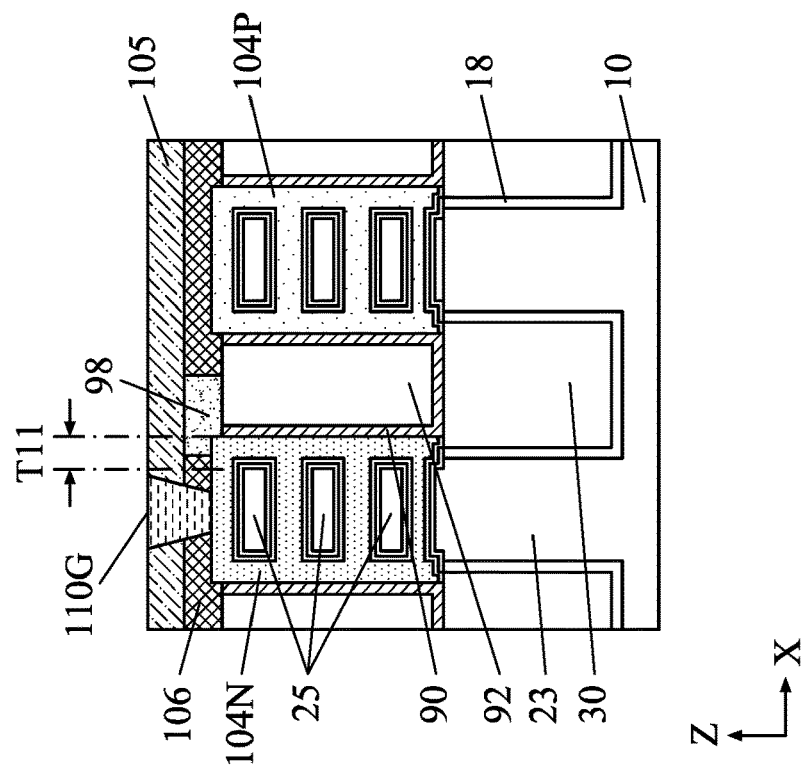
FIGS. 29A, 29B, 29C and 29D show various views of a semiconductor GAA FET device according to an embodiment of the present disclosure.
Figure 29A:
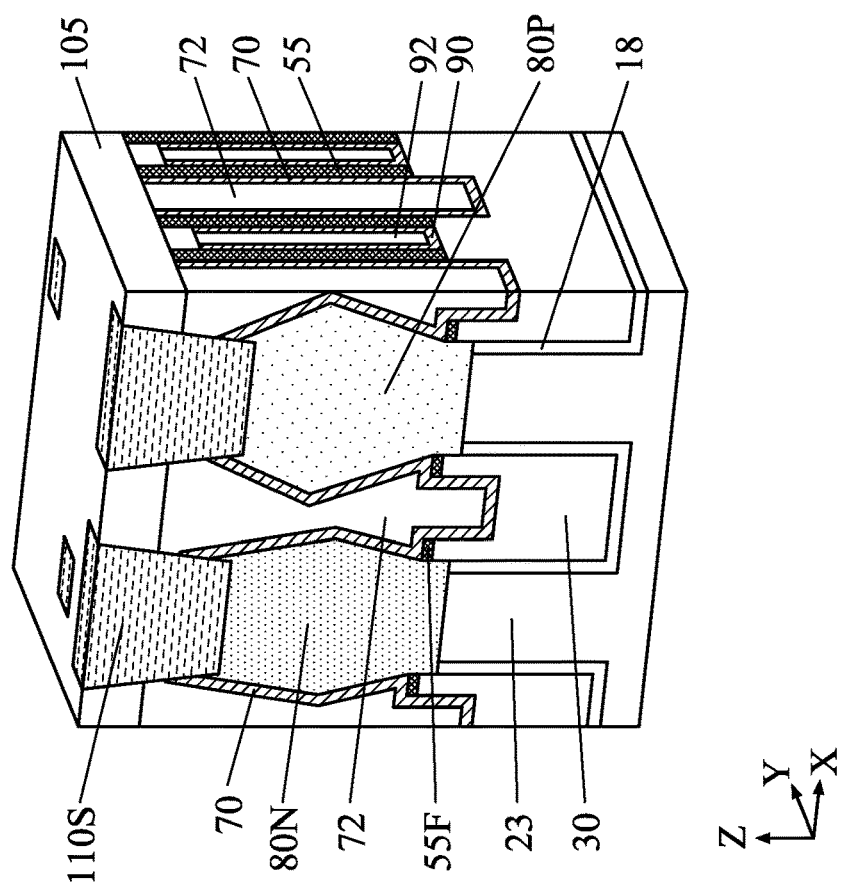
Figure 29D:
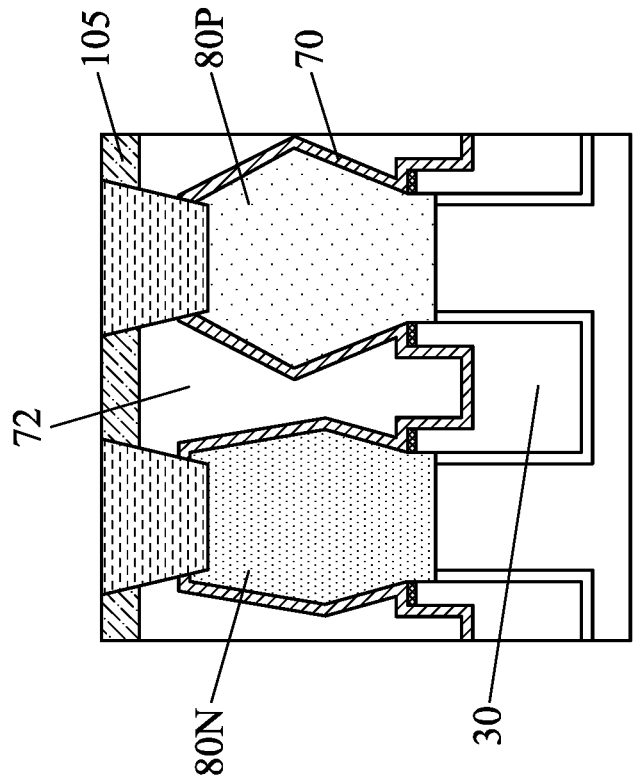
Figure 29C:
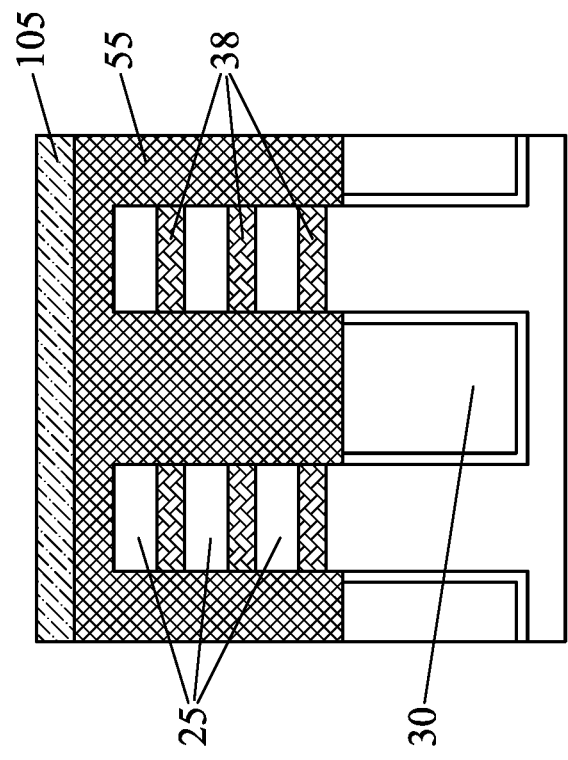

After the insulating plug 98 is formed, one or more additional ILD layers 105 are formed over the conductive layer 106 and the insulating plug 98, and then a conductive contact 110G to the gate electrode and/or a contact 110S to the source/drain epitaxial layers are formed as shown in FIGS. 29A-29D. FIG. 29B is a cross sectional view along the X direction cutting the gate electrodes, FIG. 29C is a cross sectional view along the X direction cutting the inner spacers 38 and FIG. 29D is a cross sectional view along the X direction cutting the source/drain epitaxial layers. In some embodiments, the additional ILD layer 105 includes one or more of silicon oxide, silicon nitride, SiON, SiCN, SiOC, SiOCN or SiC. The conductive contact 110G and 110S include one or more of W, Ru, Mo, Co, Ni, Cu, Al, Ti, Ta or an alloy thereof.

As shown in FIGS. 29B and 29D, an insulating separation structure between the adjacent gate electrodes includes the insulating layers 90 and 92, and an insulating separation structure between the adjacent source/drain epitaxial layers includes the insulating layers 70 and 72. In some embodiments, the insulating layers 70 and 90 (thinner layers) are made of different materials from each other, and/or the insulating layers 72 and 92 (thicker layers) are made of different materials from each other. In some embodiments, the insulating layers 70 and 90 (thinner layers) have different thicknesses from each other. The insulating separation structure between the adjacent gate electrodes is discontinuous from the insulating separation structure between the adjacent source/drain epitaxial layers. In some embodiments, the insulating separation structure between the adjacent gate electrodes is in direct contact with the gate electrode 104P, 104N without an interposing gate dielectric layer 102. As shown in FIG. 29B, a part of the conductive layer 106 is disposed over the insulating separation structure 90, 92 between the adjacent gate electrodes in some embodiments. In some embodiments, the thickness T11 of the gate electrode 104P or 104N at the side of the channel (distance between the channel and the insulating separation structure) is in a range from about 4 nm to about 7 nm.

Figure 30A:
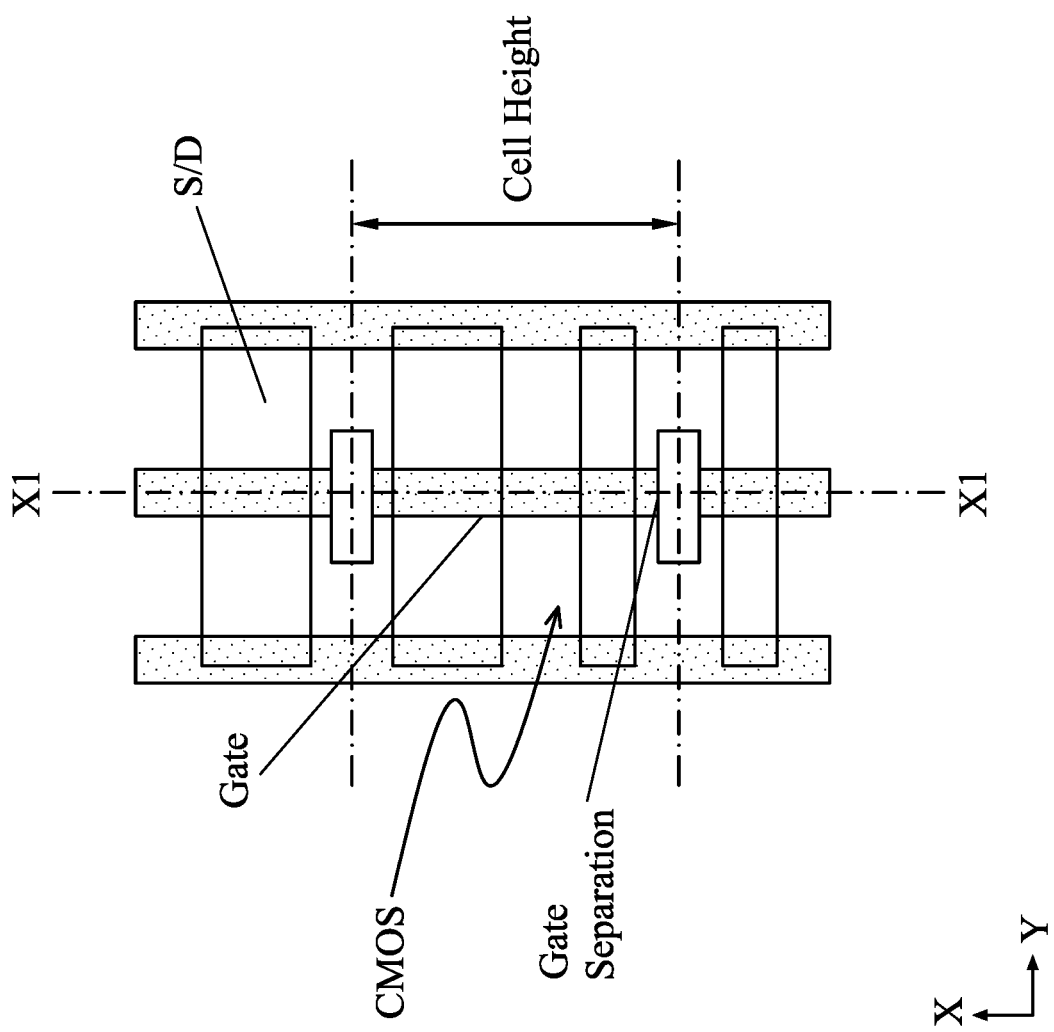
FIGS. 30A and 30B show various views of a semiconductor GAA FET device according to an embodiment of the present disclosure.
Figure 30B:
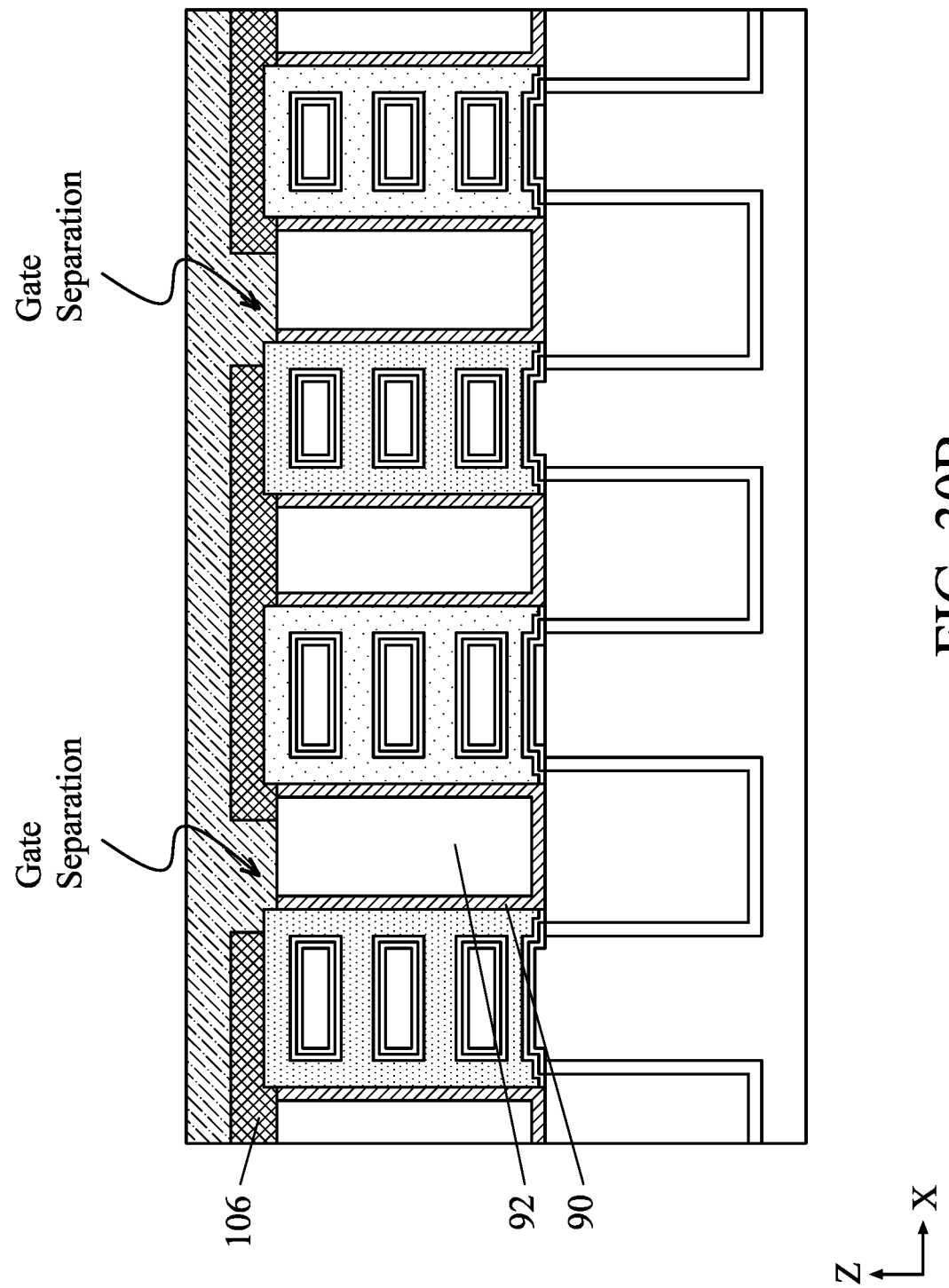

FIG. 30A is a plan or layout view and FIG. 30B shows a cross sectional view along line X1-X1 of FIG. 30A of a semiconductor GAA FET device according to an embodiment of the present disclosure. In some embodiments, as shown in FIG. 30A, the semiconductor device include a CMOS structure as a standard cell. The gate separation structures 90, 92 are disposed at the cell boundaries to separate the gate electrode of one cell from the gate electrode of another cell. In some embodiments, a channel width of an n-type FET is different than (greater or smaller than) a channel width of a p-type FET connected by the conductive layer 106 in one cell.

FIGS. 31A, 31B, 31C, 31D, 31E and 31F show various views of semiconductor GAA FET devices according to embodiments of the present disclosure.

FIG. 31A is the same as FIG. 29A, where the isolation insulating layer 30 is partially recessed between the adjacent source/drain epitaxial layers in the operation explained with respect to FIG. 11. In some embodiments, as shown in FIG. 31B, the isolation insulating layer 30 is not recessed between the adjacent source/drain epitaxial layers in the operation explained with respect to FIG. 11.

Figure 31D:
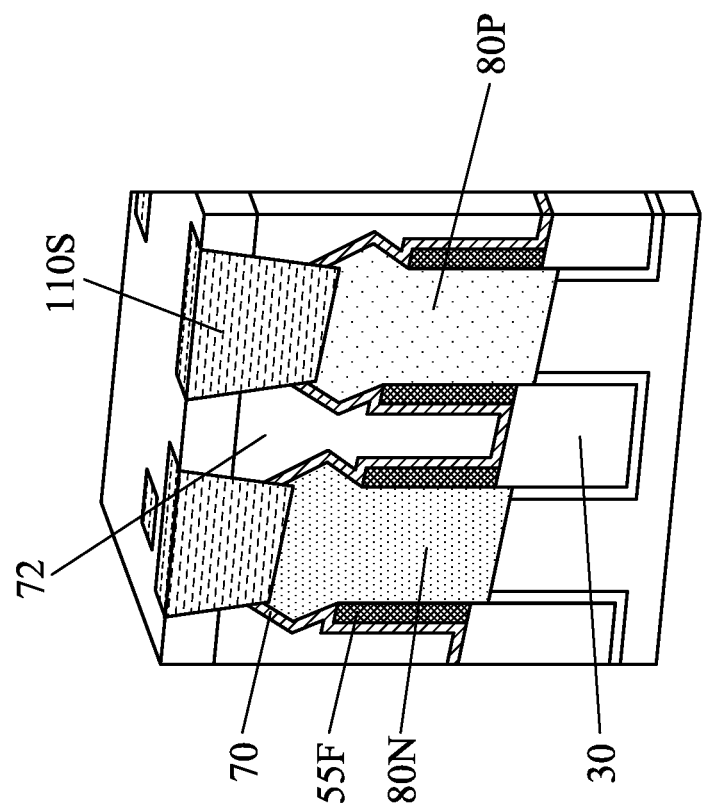
Figure 31C:
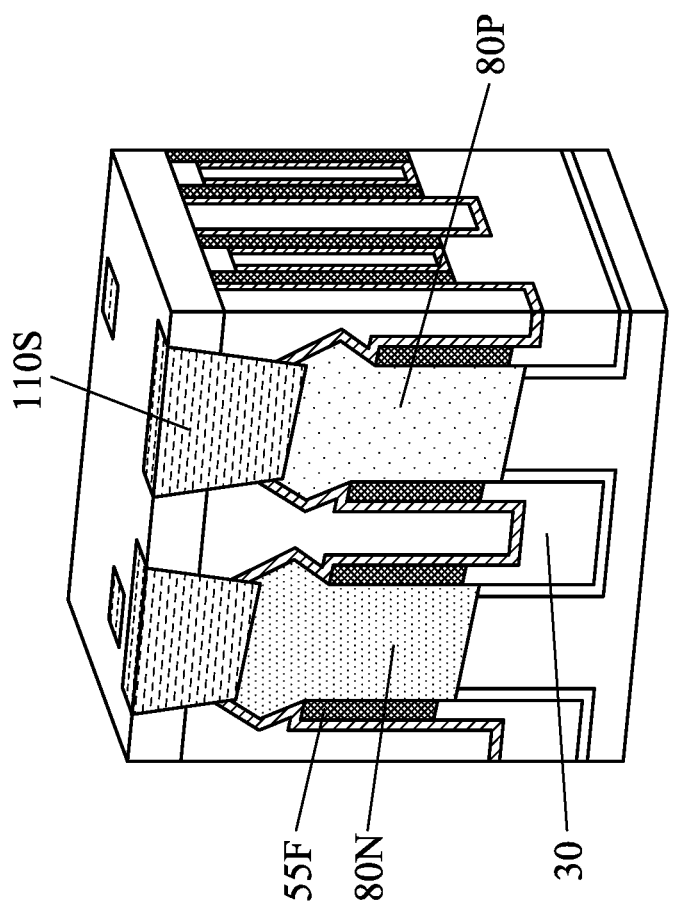

FIGS. 31C and 31D correspond to the operations explained with respect to FIGS. 14A-14C. In FIG. 31C, the isolation insulating layer 30 is partially recessed between the adjacent source/drain epitaxial layers and in FIG. 31D, the isolation insulating layer 30 is not recessed between the adjacent source/drain epitaxial layers. In some embodiments, a part of the fin sidewalls 55F remains under the etch stop layer 70.

Figures 31E, 31F:
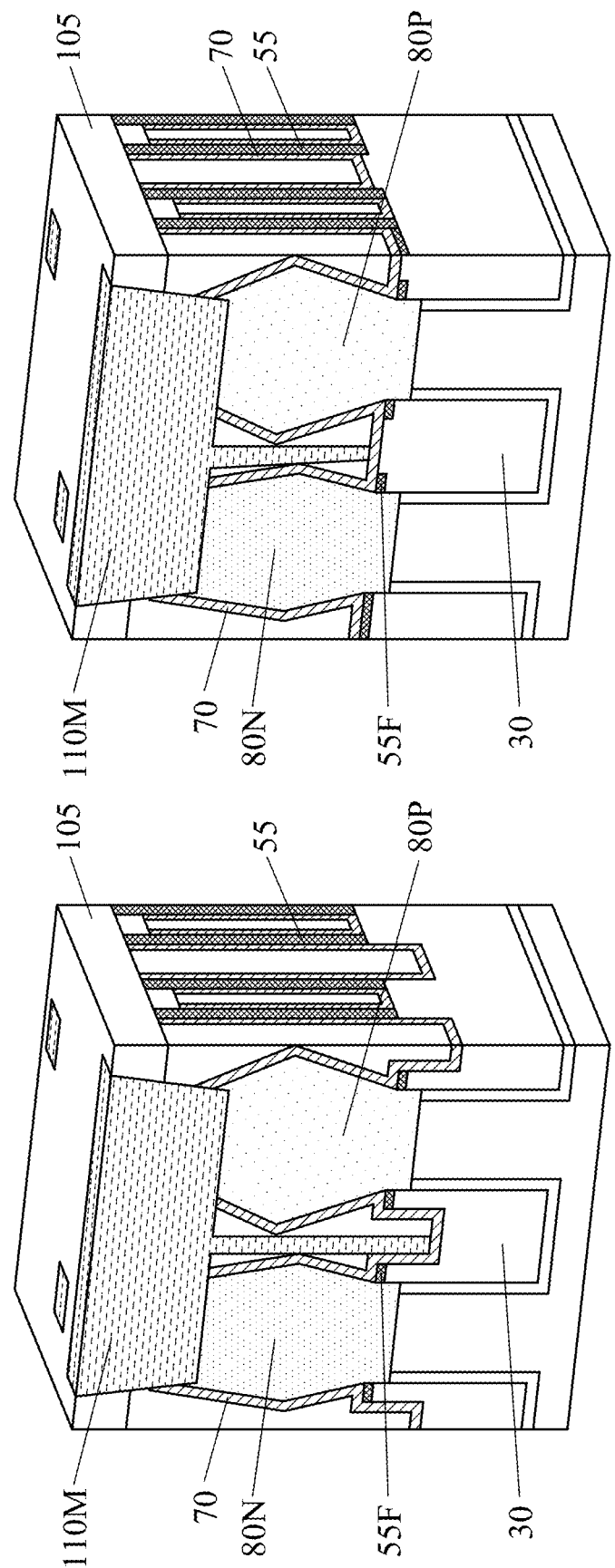
Figure 32B:
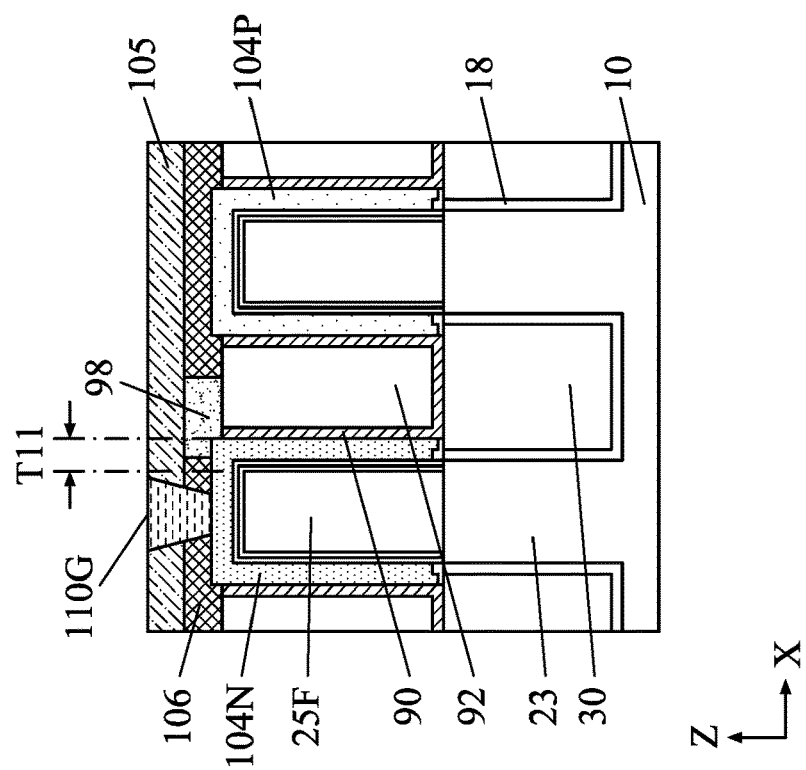
FIGS. 32A, 32B, 32C and 32D show various views of a semiconductor GAA FET device according to an embodiment of the present disclosure.
Figure 32A:
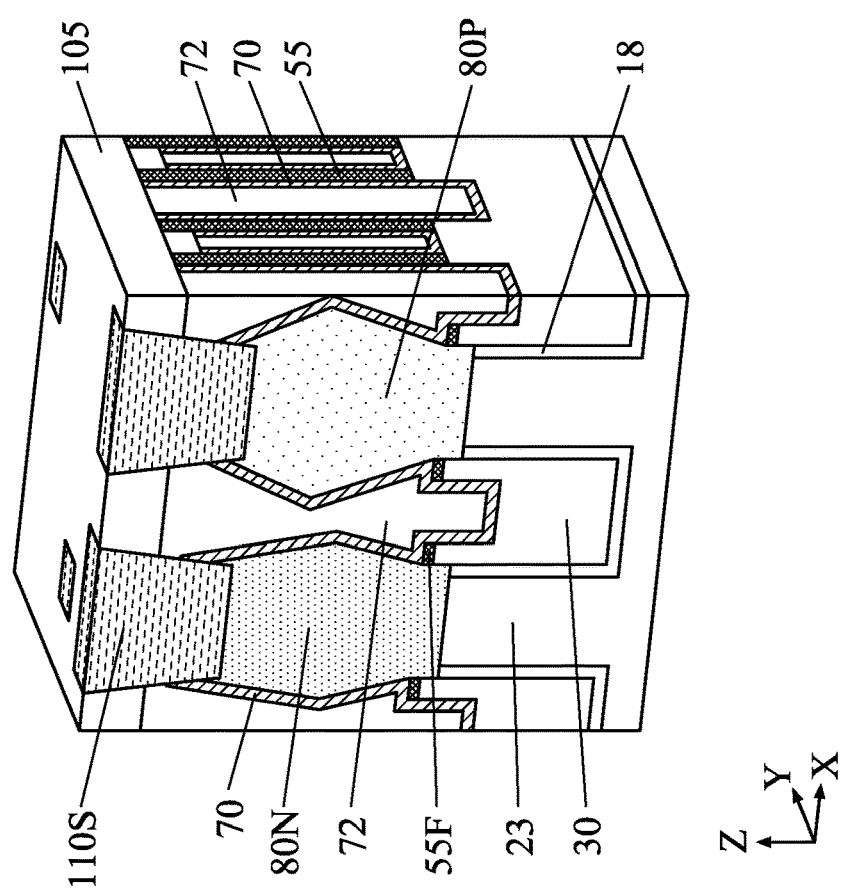
Figure 32D:
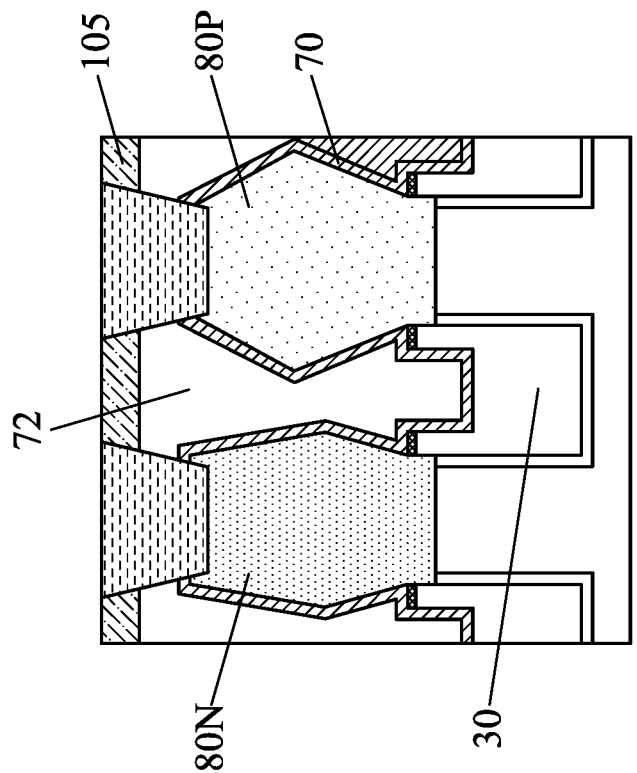
Figure 32C:
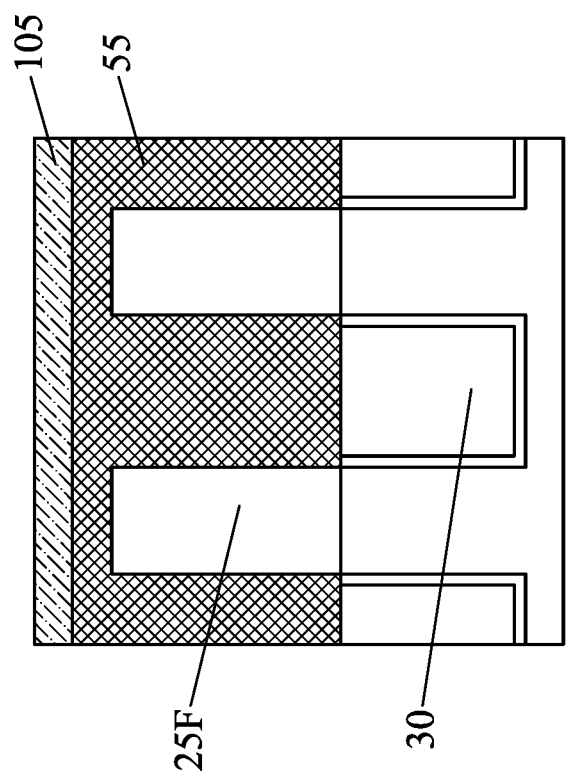

In some embodiments, two source/drain contacts are merged to form one continuous contact 110M as shown in FIGS. 31E and 31F. In FIG. 31E, the isolation insulating layer 30 is partially recessed between the adjacent source/drain epitaxial layers, and in FIG. 31F, the isolation insulating layer 30 is not recessed between the adjacent source/drain epitaxial layers. The source/drain structures of FIGS. 31C and 31D can be applied to the source/drain contact structures shown in FIGS. 31E and 31F.

It is understood that the FET undergoes further CMOS processes to form various features such as contacts/vias, interconnect metal layers, dielectric layers, passivation layers, etc.

In the embodiments above, FinFETs can be used instead of GAA FETs, as shown in FIGS. 32A-32D. Instead of the nano sheets or wires 25, a fin 25F continuous from the bottom fin structure 23 is used as a channel region.

In the foregoing embodiments, a separation wall is provided only between adjacent gate structures and does not extend into an area between adjacent source/drain epitaxial layers, and/or different separation structures are provided for the gate structures and the source/drain epitaxial layers, and thus it is possible to reduce the cell size (cell height) of a standard cell (or CMOS cell). Further, the electrical separation of adjacent gate electrodes is provided by separating a conductive layer (top gate electrode layer) 106, which is performed by a self-align manner, a process margin can be improved.

It will be understood that not all advantages have been necessarily discussed herein, no particular advantage is required for all embodiments or examples, and other embodiments or examples may offer different advantages.

In accordance with an aspect of the present disclosure, in a method of manufacturing a semiconductor device, a fin structure including a stacked layer of first semiconductor layers and second semiconductor layers disposed over a bottom fin structure is formed, an isolation insulating layer is formed so that the stacked layer are exposed from the isolation insulating layer, a sacrificial cladding layer is formed over at least sidewalls of the exposed stacked layer, a sacrificial gate electrode is formed over the exposed stacked layer, an interlayer dielectric (ILD) layer is formed, the sacrificial gate electrode is partially recessed to leave a pillar of the remaining sacrificial gate electrode, the sacrificial cladding layer and the first semiconductor layers are removed, a gate dielectric layer wrapping around the second semiconductor layer and a gate electrode over the gate dielectric layer are formed, the pillar is removed, and one or more dielectric layers are formed in a space from which the pillar is removed. In one or more of the foregoing or following embodiments, the first semiconductor layers are made of SiGe and the second semiconductor layers are made of Si. In one or more of the foregoing or following embodiments, the sacrificial cladding layer is made of SiGe. In one or more of the foregoing or following embodiments, the sacrificial cladding layer is amorphous or polycrystalline. In one or more of the foregoing or following embodiments, the fin structure further includes a first insulating liner layer on a top of the stacked layer and a top semiconductor layer on the first insulating liner layer. In one or more of the foregoing or following embodiments, the top semiconductor layer is made of SiGe. In one or more of the foregoing or following embodiments, before the sacrificial cladding layer is formed, a second insulating liner layer is formed. In one or more of the foregoing or following embodiments, the sacrificial gate electrode is recessed to a level between a bottom of the top semiconductor layer and a top of the top semiconductor layer.

In accordance with another aspect of the present disclosure, in a method of manufacturing a semiconductor device, first and second fin structures, each including a stacked layer of first semiconductor layers and second semiconductor layers disposed over a bottom fin structure and a hard mask layer over the stacked layer, are formed, an isolation insulating layer is formed so that the hard mask layer and the stacked layer are exposed from the isolation insulating layer, a sacrificial cladding layer is formed over at least sidewalls of the exposed hard mask layer and stacked layer, a sacrificial gate electrode is formed over the exposed stacked layer of the first and second fin structures, a source/drain epitaxial layer is formed over source/drain regions of the first and second fin structures, an interlayer dielectric (ILD) layer is formed over the source/drain epitaxial layer, the sacrificial gate electrode is partially recessed to leave a pillar of the remaining sacrificial gate electrode between the first and second fin structures, the sacrificial cladding layer and the first semiconductor layers are removed from the first and second fin structures, a gate dielectric layer wrapping around the second semiconductor layer of the first and second fin structures is formed, a first gate electrode is formed over the bottom fin structure of the first fin structure and a second gate electrode is formed over the bottom fin structure of the second fin structure, the pillar is removed, and a gate separation wall including one or more dielectric layers is formed in a space from which the pillar is removed. In one or more of the foregoing or following embodiments, the gate separation wall includes a first insulating layer and a second insulating layer made of a different material from the first insulating layer. In one or more of the foregoing or following embodiments, the first insulating layer is in direct contact with the first gate electrode and the second gate electrode. In one or more of the foregoing or following embodiments, a top gate electrode is further formed over the first gate electrode and the second gate electrode. In one or more of the foregoing or following embodiments, an opening is formed in the top gate electrode to separate the top gate electrode, and the opening is filled with an insulating material. In one or more of the foregoing or following embodiments, the top gate electrode after separated is in contact with at least one of the first insulating layer or the second insulating layer of the gate separation wall. In one or more of the foregoing or following embodiments, the source/drain epitaxial layer formed at the source/drain regions of the first fin structure and the source/drain epitaxial layer formed at the source/drain regions of the second fin structure is separated by an epitaxial layer separation structure, and the epitaxial layer separation structure includes a first dielectric layer in direct contact with the source/drain epitaxial layer and a second dielectric layer made of a different material from the first dielectric layer. In one or more of the foregoing or following embodiments, the first insulating layer of the gate separation wall and the first dielectric layer of the epitaxial layer separation structure are made of different material from each other. In one or more of the foregoing or following embodiments, the second insulating layer of the gate separation wall and the second dielectric layer of the epitaxial layer separation structure are made of different material from each other.

In a method of manufacturing a semiconductor device, first and second fin structures, each including a stacked layer of first semiconductor layers and second semiconductor layers disposed over a bottom fin structure and a hard mask layer over the stacked layer, are formed, an isolation insulating layer is formed so that the hard mask layer and the stacked layer are exposed from the isolation insulating layer, a sacrificial cladding layer is formed over at least sidewalls of the exposed hard mask layer and stacked layer, a sacrificial gate electrode is formed over the exposed stacked layer of the first and second fin structures, an interlayer dielectric (ILD) layer is formed, the sacrificial gate electrode is partially recessed to leave a pillar of the remaining sacrificial gate electrode between the first and second fin structures, the sacrificial cladding layer and the first semiconductor layers are removed from the first and second fin structures, a gate dielectric layer wrapping around the second semiconductor layer of the first and second fin structures is formed, a first gate electrode is formed over the bottom fin structure of the first fin structure and a second gate electrode is formed over the bottom fin structure of the second fin structure, the pillar is removed, a gate separation wall including one or more dielectric layers is formed in a gate space from which the pillar is removed, a top gate electrode is formed over the first gate electrode and the second gate electrode, an opening is formed in the top gate electrode to separate the top gate electrode, and the opening is filled with an insulating material. In one or more of the foregoing or following embodiments, an additional ILD layer is formed over the top gate electrode, and a gate contact and a source/drain contact are formed. In one or more of the foregoing or following embodiments, a part of the first gate electrode or the second gate electrode is exposed in the opening.

In accordance with another aspect of the present disclosure, a semiconductor device includes a first gate-all-around field effect transistor (GAA FET) and a second GAA FET, and a gate separation wall disposed between the first GAA FET and the second GAA FET and disposed on an isolation insulating layer. The gate separation wall includes a first dielectric layer and a second dielectric layer disposed over the first dielectric layer, and a gate electrode of at least one of the first GAA FET or the second GAA FET is in contact with an upper surface of the gate separation wall. In one or more of the foregoing or following embodiments, a gate electrode of the first GAA FET and a gate electrode of the second GAA FET are discontinuous. In one or more of the foregoing or following embodiments, the first dielectric layer is in direct contact with a side of a gate electrode of the first GAA FET and a gate electrode of the second GAA FET. In one or more of the foregoing or following embodiments, no gate dielectric layer is disposed between the gate separation wall and gate electrodes of the first GAA FET and the second GAA FET. In one or more of the foregoing or following embodiments, a channel width of the first GAA FET is different from a channel width of the second GAA FET. In one or more of the foregoing or following embodiments, a height of the gate separation wall is lower than a height of a gate electrode of the first GAA FET and a gate electrode of the second GAA FET.

In accordance with another aspect of the present disclosure, a semiconductor device includes a first field effect transistor (FET) and a second FET, and a gate separation wall disposed between the first FET and the second FET and disposed on an isolation insulating layer. The gate separation wall includes a first dielectric layer and a second dielectric layer disposed over the first dielectric layer. Each of the first and second FETs includes a source/drain epitaxial layer. The source/drain epitaxial layer of the first FET and the source/drain epitaxial layer of the second FET is separated by a separation structure. The gate separation wall has a different layer structure than the separation structure. In one or more of the foregoing or following embodiments, at least one layer of the of the gate separation wall is made of a different material of any layer of the separation structure. In one or more of the foregoing or following embodiments, the gate separation wall includes a first insulating layer in direct contact with a gate electrode of the first and second FET and a second insulating layer made of a different material from the first insulating layer, and the separation structure includes a first dielectric layer in direct contact with the source/drain epitaxial layer and a second dielectric layer made of a different material from the first dielectric layer. In one or more of the foregoing or following embodiments, the first insulating layer is made of a different material than the first dielectric layer. In one or more of the foregoing or following embodiments, the second insulating layer is made of a different material than the second dielectric layer. In one or more of the foregoing or following embodiments, the first insulating layer has a different thickness than the first dielectric layer. In one or more of the foregoing or following embodiments, the separation structure penetrate into an isolation insulating layer. In one or more of the foregoing or following embodiments, a distance between a channel of the first FET or the second FET and the gate separation wall is in a range from 4 nm to 7 nm.

In accordance with another aspect of the present disclosure, a semiconductor device includes a first gate-all-around field effect transistor (GAA FET) and a second GAA FET, and a gate separation wall disposed between the first GAA FET and the second GAA FET and disposed on an isolation insulating layer. Each of the first and second GAA FET includes a plurality of semiconductor sheets or wires vertically arranged over a bottom fin structure, a gate dielectric layer wrapping around each of the plurality of semiconductor sheets, a gate electrode disposed over the gate dielectric layer, a top gate electrode disposed over the gate electrode, a source/drain epitaxial layer, a gate sidewall spacer, and inner spacers disposed between ends of the plurality of semiconductor sheets and the source/drain epitaxial layer. The gate separation wall is in direct contact with the gate electrode of the first GAA FET and the second GAA FET. In one or more of the foregoing or following embodiments, the gate sidewall spacer and the inner spacers are made of a same insulating material. In one or more of the foregoing or following embodiments, the gate sidewall spacer and the inner spacers are made of different insulating materials from each other. In one or more of the foregoing or following embodiments, a top gate electrode of at least one of the first GAA FET and the second GAA FET is in contact with a top of the gate separation wall. In one or more of the foregoing or following embodiments, the top gate electrode of the first GAA FET is separated by an insulating plug from the top gate electrode of the second GAA FET, and the insulating plug is in contact with a top of the gate separation wall. In one or more of the foregoing or following embodiments, the source/drain epitaxial layer of the first GAA FET and the source/drain epitaxial layer of the second GAA FET is separated by a separation structure, the gate separation wall includes a first insulating layer in direct contact with the gate electrode of the first and second GAA FETs and a second insulating layer made of a different material from the first insulating layer, the separation structure includes a first dielectric layer in direct contact with the source/drain epitaxial layer and a second dielectric layer made of a different material from the first dielectric layer, and at least one of a thickness or a material of the first insulating layer is different from that of the first dielectric layer.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of manufacturing a semiconductor device, comprising:
    forming a fin structure including a stacked layer of first semiconductor layers and second semiconductor layers disposed over a bottom fin structure;
    forming an isolation insulating layer so that the stacked layer is exposed from the isolation insulating layer;
    forming a sacrificial cladding layer over at least sidewalls of the exposed stacked layer;
    forming a sacrificial gate electrode over the exposed stacked layer;
    forming an interlayer dielectric (ILD) layer over the exposed stacked layer;
    partially recessing the sacrificial gate electrode to leave a pillar of a remaining sacrificial gate electrode;
    removing the sacrificial cladding layer and the first semiconductor layers;
    forming a gate dielectric layer wrapping around the second semiconductor layers and a gate electrode over the gate dielectric layer;
    removing the pillar; and
    forming one or more dielectric layers in a space from which the pillar is removed.

2. The method of claim 1, wherein the first semiconductor layers are made of SiGe and the second semiconductor layers are made of Si.

3. The method of claim 2, wherein the sacrificial cladding layer is made of SiGe.

4. The method of claim 3, wherein the sacrificial cladding layer is amorphous or polycrystalline.

5. The method of claim 1, wherein the fin structure further includes a first insulating liner layer on a top of the stacked layer and a top semiconductor layer on the first insulating liner layer.

6. The method of claim 5, wherein the top semiconductor layer is made of SiGe.

7. The method of claim 5, wherein before the sacrificial cladding layer is formed, a second insulating liner layer is formed.

8. The method of claim 5, wherein the sacrificial gate electrode is recessed to a level between a bottom of the top semiconductor layer and a top of the top semiconductor layer.

9. A method of manufacturing a semiconductor device, comprising:
    forming first and second fin structures, each including a stacked layer of first semiconductor layers and second semiconductor layers disposed over a bottom fin structure and a hard mask layer over the stacked layer;
    forming an isolation insulating layer so that the hard mask layer and the stacked layer are exposed from the isolation insulating layer;
    forming a sacrificial cladding layer over at least sidewalls of the exposed hard mask layer and stacked layer;
    forming a sacrificial gate electrode over the exposed stacked layer of the first and second fin structures;
    forming a source/drain epitaxial layer over source/drain regions of the first and second fin structures;
    forming an interlayer dielectric (ILD) layer over the source/drain epitaxial layer;

partially recessing the sacrificial gate electrode to leave a pillar of a remaining sacrificial gate electrode between the first and second fin structures;

removing the sacrificial cladding layer and the first semiconductor layers from the first and second fin structures;

forming a gate dielectric layer wrapping around the second semiconductor layers of the first and second fin structures;

forming a first gate electrode over the bottom fin structure of the first fin structure and a second gate electrode over the bottom fin structure of the second fin structure;

removing the pillar; and forming a gate separation wall including one or more dielectric layers in a space from which the pillar is removed.

10. The method of claim 9, wherein the gate separation wall includes a first insulating layer and a second insulating layer made of a different material from the first insulating layer.

11. The method of claim 10, wherein the first insulating layer is in direct contact with the first gate electrode and the second gate electrode.

12. The method of claim 10, further comprising forming a top gate electrode over the first gate electrode and the second gate electrode.

13. The method of claim 12, further comprising:
forming an opening in the top gate electrode to separate the top gate electrode; and
filling the opening with an insulating material.

14. The method of claim 13, wherein after separating, the top gate electrode is in contact with at least one of the first insulating layer or the second insulating layer of the gate separation wall.

15. The method of claim 10, wherein:
the source/drain epitaxial layer formed at the source/drain regions of the first fin structure and the source/drain epitaxial layer formed at the source/drain regions of the second fin structure are separated by an epitaxial layer separation structure, and the epitaxial layer separation structure includes a first dielectric layer in direct contact with the source/drain epitaxial layer and a second dielectric layer made of a different material than the first dielectric layer.

16. The method of claim 15, wherein the first insulating layer of the gate separation wall and the first dielectric layer of the epitaxial layer separation structure are made of different materials from each other.

17. The method of claim 15, wherein the second insulating layer of the gate separation wall and the second dielectric layer of the epitaxial layer separation structure are made of different materials from each other.

18. A semiconductor device comprising:
a first gate-all-around field effect transistor (GAA FET) and a second GAA FET; and
a gate separation wall disposed between the first GAA FET and the second GAA FET and disposed on an isolation insulating layer, wherein:
the gate separation wall includes a first dielectric layer and a second dielectric layer embedded in the first dielectric layer, and
a gate electrode of at least one of the first GAA FET or the second GAA FET is in contact with an upper surface of the gate separation wall.

19. The semiconductor device of claim 18, wherein a gate electrode of the first GAA FET and a gate electrode of the second GAA FET are discontinuous.

20. The semiconductor device of claim 18, wherein the first dielectric layer is in direct contact with a side of a gate electrode of the first GAA FET and a gate electrode of the second GAA FET.

* * * * *